(12) United States Patent
O'Neill et al.

(10) Patent No.: US 10,510,913 B2
(45) Date of Patent: *Dec. 17, 2019

(54) LIGHT REDIRECTING FILM USEFUL WITH SOLAR MODULES

(71) Applicant: 3M INNOVATIVE PROPERTIES COMPANY, St. Paul, MN (US)

(72) Inventors: Mark B. O'Neill, Stillwater, MN (US); Jiaying Ma, Cottage Grove, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/188,956

(22) Filed: Nov. 13, 2018

(65) Prior Publication Data
US 2019/0088810 A1    Mar. 21, 2019

Related U.S. Application Data

(63) Continuation of application No. 15/291,159, filed on Oct. 12, 2016, now Pat. No. 10,205,041.
(Continued)

(51) Int. Cl.
*H01L 31/054* (2014.01)
*G02B 5/04* (2006.01)
(Continued)

(52) U.S. Cl.
CPC .......... *H01L 31/0547* (2014.12); *G02B 5/045* (2013.01); *G02B 19/0019* (2013.01);
(Continued)

(58) Field of Classification Search
CPC .... G02B 5/045; G02B 19/0019; H01L 31/054
(Continued)

(56) References Cited

U.S. PATENT DOCUMENTS

| 4,235,643 A | 11/1980 | Amick |
| 4,246,042 A | 1/1981 | Knasel |

(Continued)

FOREIGN PATENT DOCUMENTS

| CN | 101287595 | 10/2008 |
| CN | 102217090 | 10/2011 |

(Continued)

OTHER PUBLICATIONS

Smith, Modern Optical Engineering, 104-105 (1966).
(Continued)

*Primary Examiner* — Niki Bakhtiari
(74) *Attorney, Agent, or Firm* — Gregg H. Rosenblatt

(57) ABSTRACT

A light redirecting film defining a longitudinal axis, and including a base layer, an ordered arrangement of a plurality of microstructures, and a reflective layer. The microstructures project from the base layer, and each extends across the base layer to define a corresponding primary axis. The primary axis of at least one of the microstructures is oblique with respect to the longitudinal axis. The reflective layer is disposed over the microstructures opposite the base layer. When employed, for example, to cover portions of a PV module tabbing ribbon, or areas free of PV cells, the films of the present disclosure uniquely reflect incident light.

12 Claims, 12 Drawing Sheets

Related U.S. Application Data

(60) Provisional application No. 62/240,001, filed on Oct. 12, 2015.

(51) Int. Cl.
*G02B 19/00* (2006.01)
*H01L 31/0236* (2006.01)
*H01L 31/048* (2014.01)
*H01L 31/05* (2014.01)

(52) U.S. Cl.
CPC .... *G02B 19/0042* (2013.01); *H01L 31/02366* (2013.01); *H01L 31/048* (2013.01); *H01L 31/0488* (2013.01); *H01L 31/0508* (2013.01); *H01L 31/0512* (2013.01); *Y02E 10/52* (2013.01)

(58) Field of Classification Search
USPC .............................................. 136/243–265
See application file for complete search history.

(56) References Cited

U.S. PATENT DOCUMENTS

| | | |
|---|---|---|
| 4,307,150 A | 12/1981 | Roche |
| 4,576,850 A | 3/1986 | Martens |
| 4,751,191 A | 6/1988 | Gonsiorawski |
| 5,074,920 A | 12/1991 | Gonsiorawski |
| 5,076,857 A | 12/1991 | Nowlan |
| 5,118,362 A | 6/1992 | St. Angelo |
| 5,122,902 A | 6/1992 | Benson |
| 5,178,685 A | 1/1993 | Borenstein |
| 5,320,684 A | 6/1994 | Amick |
| 5,413,568 A | 5/1995 | Roach |
| 5,478,402 A | 12/1995 | Hanoka |
| 5,554,229 A | 9/1996 | Vogeli |
| 5,725,909 A | 3/1998 | Shaw |
| 5,994,641 A | 11/1999 | Kardauskas |
| RE36,754 E | 6/2000 | Noel |
| 6,203,898 B1 | 3/2001 | Kohler |
| 6,231,939 B1 | 5/2001 | Shaw |
| 6,280,063 B1 | 8/2001 | Fong |
| 6,348,237 B2 | 2/2002 | Kohler |
| 6,657,009 B2 | 12/2003 | Gonsiorawski |
| 6,660,930 B1 | 12/2003 | Bright |
| 6,758,992 B2 | 7/2004 | Solomon |
| 6,975,067 B2 | 12/2005 | McCormick |
| 7,018,713 B2 | 3/2006 | Padiyath |
| 7,186,465 B2 | 3/2007 | Bright |
| 7,238,878 B2 | 7/2007 | Gonsiorawski |
| 7,276,291 B2 | 10/2007 | Bright |
| 7,467,873 B2 | 12/2008 | Clarke |
| 8,443,704 B2 | 5/2013 | Burke |
| 2003/0035231 A1 | 2/2003 | Epstein |
| 2004/0187911 A1 | 9/2004 | Gaudiana |
| 2004/0241454 A1 | 12/2004 | Shaw |
| 2006/0107991 A1 | 5/2006 | Baba |
| 2007/0020451 A1 | 1/2007 | Padiyath |
| 2007/0125415 A1 | 6/2007 | Sachs |
| 2007/0138044 A1 | 6/2007 | Trotter |
| 2007/0147712 A1 | 6/2007 | Ozdeger |
| 2008/0078445 A1 | 4/2008 | Patel |
| 2008/0291541 A1 | 11/2008 | Padiyath |
| 2009/0038450 A1 | 2/2009 | Campbell |
| 2009/0066935 A1 | 3/2009 | Fujimoto |
| 2009/0178704 A1 | 7/2009 | Kalejs |
| 2009/0194148 A1 | 8/2009 | Taguchi |
| 2009/0314329 A1 | 12/2009 | Saha |
| 2009/0320908 A1 | 12/2009 | Botkin |
| 2010/0000595 A1 | 1/2010 | Haga |
| 2010/0180946 A1 | 7/2010 | Gruhlke |
| 2010/0186570 A1 | 7/2010 | Ehnes |
| 2010/0200046 A1 | 8/2010 | Sauar |
| 2010/0307565 A1 | 12/2010 | Suga |
| 2010/0330726 A1 | 12/2010 | Gonsiorawski |
| 2011/0186114 A1 | 8/2011 | Homma |
| 2011/0220195 A1 | 9/2011 | Moronaga |
| 2011/0240095 A1 | 10/2011 | Murillo-Mora |
| 2012/0012181 A1 | 1/2012 | Suga |
| 2012/0060895 A1 | 3/2012 | Rubin |
| 2012/0192918 A1 | 8/2012 | Zhou |
| 2013/0038928 A1 | 2/2013 | Padiyath |
| 2013/0236697 A1 | 9/2013 | Walker, Jr. |
| 2014/0116495 A1 | 5/2014 | Kim |
| 2014/0119033 A1 | 5/2014 | Vasylyev |
| 2014/0198390 A1 | 7/2014 | Padiyath |
| 2014/0268758 A1 | 9/2014 | Morgan |
| 2014/0293436 A1 | 10/2014 | Nagahama |
| 2015/0155411 A1 | 6/2015 | Chen |
| 2016/0172518 A1 | 6/2016 | Ma |

FOREIGN PATENT DOCUMENTS

| | | |
|---|---|---|
| CN | 102347375 | 2/2012 |
| CN | 103988101 | 8/2014 |
| CN | 106461193 | 2/2017 |
| CN | 206349378 | 7/2017 |
| EP | 2 141 747 | 1/2010 |
| JP | 11-307791 | 11/1999 |
| JP | 2005-243972 | 9/2005 |
| JP | 2010-16247 | 1/2010 |
| JP | 2010-87060 | 4/2010 |
| JP | 2010-147454 | 7/2010 |
| JP | 2011-108725 | 6/2011 |
| WO | WO 2007/047745 | 4/2007 |
| WO | WO 2012/082391 | 6/2012 |
| WO | WO 2013/027423 | 2/2013 |
| WO | WO 2013/066459 | 5/2013 |
| WO | WO 2013/066460 | 5/2013 |
| WO | WO 2013/080618 | 6/2013 |
| WO | WO 2013-148149 | 10/2013 |
| WO | WO 2015-006063 | 1/2015 |
| WO | WO 2015/006097 | 1/2015 |
| WO | WO 2015/050862 | 4/2015 |
| WO | WO 2015-095189 | 6/2015 |
| WO | WO 2016/168164 | 10/2016 |
| WO | WO 2017/066146 | 4/2017 |

OTHER PUBLICATIONS

International Preliminary Report on Patentability for PCT/US2016/027066 dated Aug. 17, 2017.
International Search Report for PCT/US2013/030367 dated May 14, 2013.
International Search Report for PCT/US2014/044344 dated Oct. 6, 2014.
International Search Report for PCT/US2014/045029 dated Oct. 6, 2014.
International Search Report for PCT/US2016/027066 dated Jul. 5, 2016.
International Search Report for PCT/US2017/040505 dated Sep. 15, 2017.
Supplemental European Search Report for EP 13 76 9124 dated Nov. 3, 2015.
Written Opinion of the International Search Authority for PCT/US16/56339 dated Dec. 22, 2016.
International Search Report for PCT/US16/56339 dated Dec. 22, 2016.

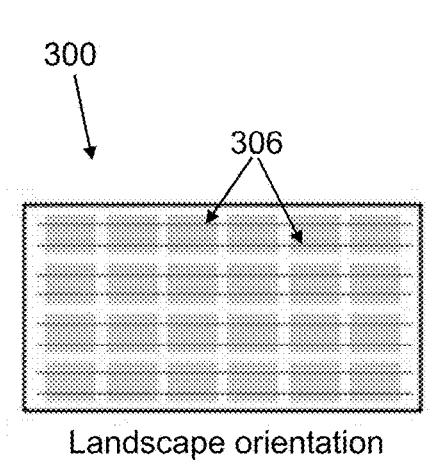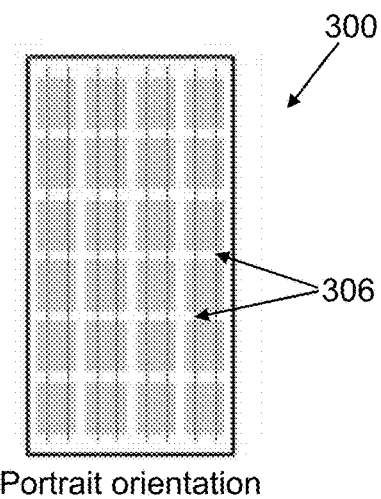
FIG. 10A — Landscape orientation
FIG. 10B — Portrait orientation
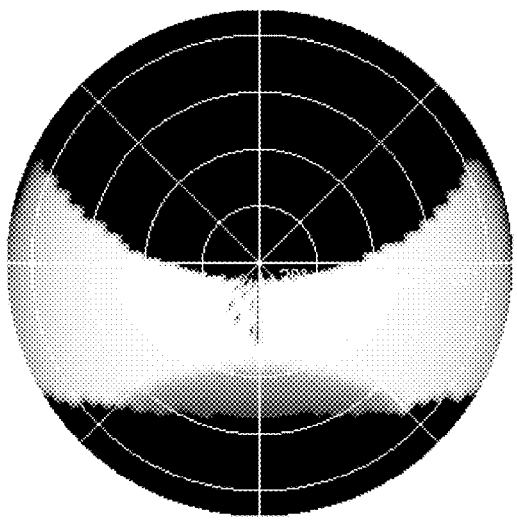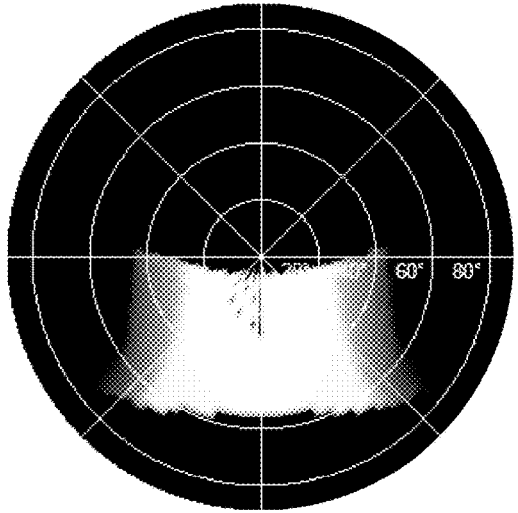
FIG. 11A
FIG. 11B

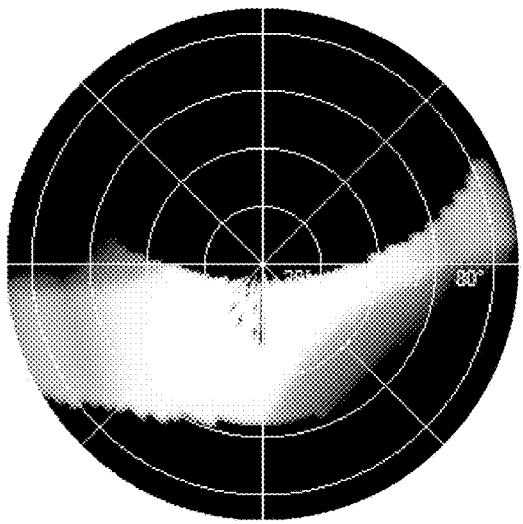 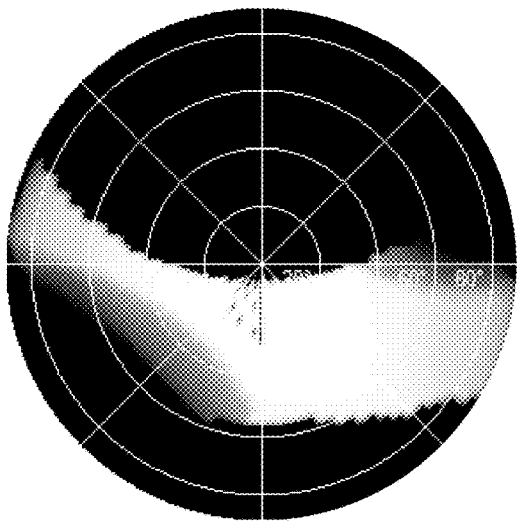
*FIG. 12A*  *FIG. 12B*
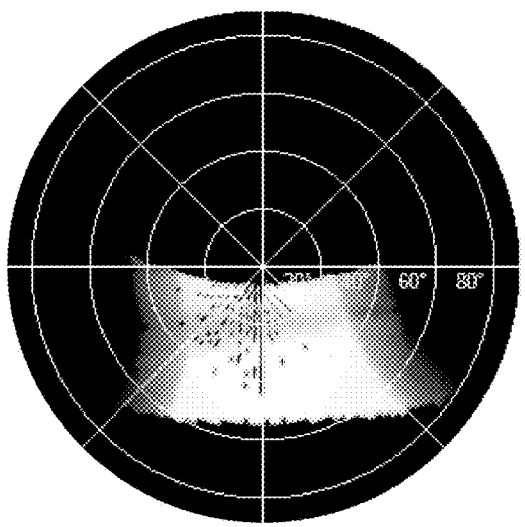 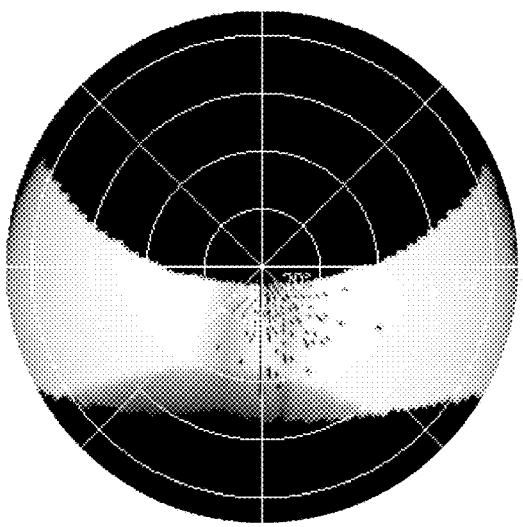
*FIG. 13A*  *FIG. 13B*

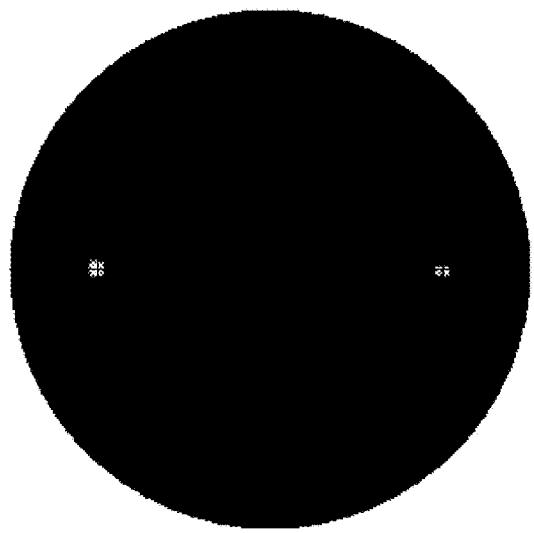
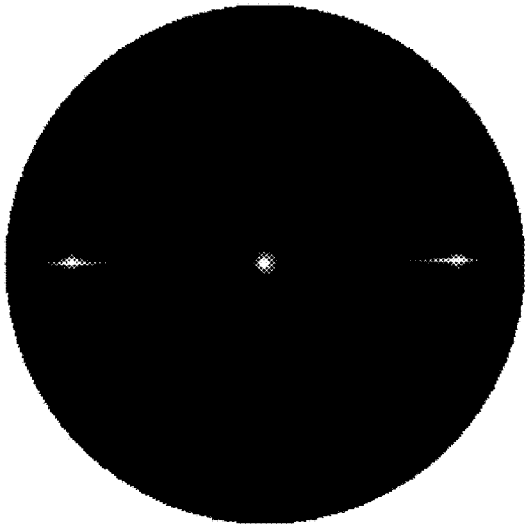
FIG. 16A  FIG. 16B
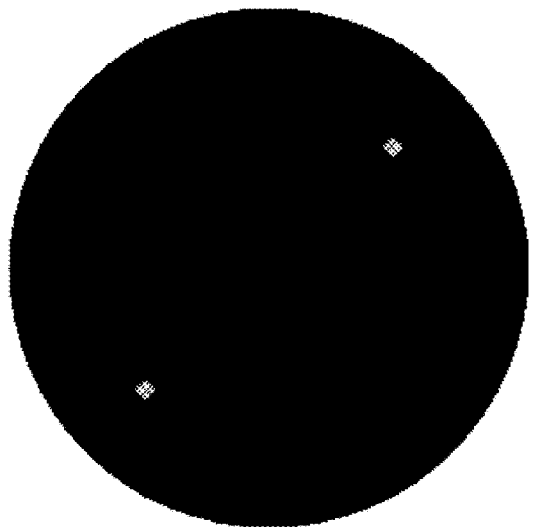
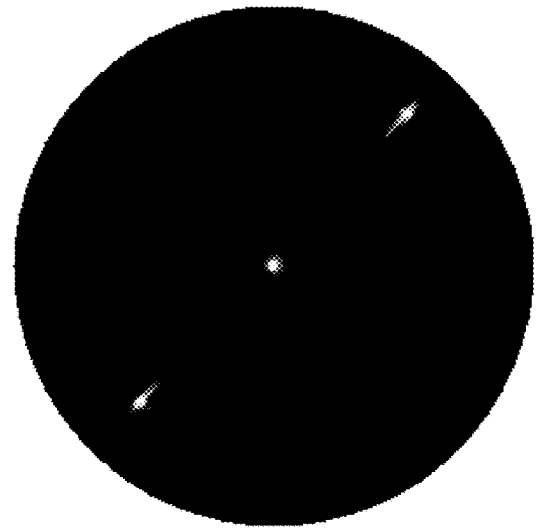
FIG. 17A  FIG. 17B

LIGHT REDIRECTING FILM USEFUL WITH SOLAR MODULES

CROSS REFERENCE TO RELATED APPLICATIONS

This application is a continuation of U.S. application Ser. No. 15/291,159, filed Oct. 12, 2016, which claims priority to Provisional U.S. application Ser. No. 62/240,001, filed Oct. 12, 2015, the disclosures of which are incorporated by reference in their entirety herein.

The present disclosure relates to reflective microstructured films, and their use in solar modules.

BACKGROUND

Renewable energy is energy derived from natural resources that can be replenished, such as sunlight, wind, rain, tides, and geothermal heat. The demand for renewable energy has grown substantially with advances in technology and increases in global population. Although fossil fuels provide for the vast majority of energy consumption today, these fuels are non-renewable. The global dependence on these fossil fuels has not only raised concerns about their depletion but also environmental concerns associated with emissions that result from burning these fuels. As a result of these concerns, countries worldwide have been establishing initiatives to develop both large-scale and small-scale renewable energy resources. One of the promising energy resources today is sunlight. Globally, millions of households currently obtain power from photovoltaic systems. The rising demand for solar power has been accompanied by a rising demand for devices and material capable of fulfilling the requirements for these applications.

Harnessing sunlight may be accomplished by the use of photovoltaic (PV) cells (also referred to as solar cells), which are used for photoelectric conversion (e.g., silicon photovoltaic cells). PV cells are relatively small in size and typically combined into a physically integrated PV module (or solar module) having a correspondingly greater power output. PV modules are generally formed from two or more "strings" of PV cells, with each string consisting of a plurality of PV cells arranged in a row and are typically electrically connected in series using tinned flat copper wires (also known as electrical connectors, tabbing ribbons, or bus wires). These electrical connectors are typically adhered to the PV cells by a soldering process.

PV modules typically further comprise the PV cell(s) surrounded by an encapsulant, such as generally described in U.S. Patent Application Publication No. 2008/0078445 (Patel et al.), the teachings of which are incorporated herein by reference. In some constructions, the PV module includes encapsulant on both sides of the PV cell(s). A panel of glass (or other suitable polymeric material) is bonded to each of the opposing, front and back sides, respectively, of the encapsulant. The panels are transparent to solar radiation and are typically referred to as the front-side layer and the backside layer (or backsheet). The front-side layer and the backsheet may be made of the same or a different material. The encapsulant is a light-transparent polymer material that encapsulates the PV cells and also is bonded to the front-side layer and the backsheet so as to physically seal off the PV cells. This laminated construction provides mechanical support for the PV cells and also protects them against damage due to environmental factors such as wind, snow and ice. The PV module is typically fit into a metal frame, with a sealant covering the edges of the module engaged by the metal frame. The metal frame protects the edges of the module, provides additional mechanical strength, and facilitates combining it with other modules so as to form a larger array or solar panel that can be mounted to a suitable support that holds the modules together at a desired angle appropriate to maximize reception of solar radiation.

The art of making PV cells and combining them to make laminated modules is exemplified by the following U.S. Pat. No. 4,751,191 (Gonsiorawski et al.); U.S. Pat. No. 5,074,920 (Gonsiorawski et al.); U.S. Pat. No. 5,118,362 (St. Angelo et al.); U.S. Pat. No. 5,178,685 (Borenstein et al.); U.S. Pat. No. 5,320,684 (Amick et al.); and U.S. Pat. No. 5,478,402 (Hanoka).

With many PV module designs, the tabbing ribbons represent an inactive shading region (i.e., area in which incident light is not absorbed for photovoltaic or photoelectric conversion). The total active surface area (i.e., the total area in which incident light is use for photovoltaic or photoelectric conversion) is thus less than 100% of the original photovoltaic cell area due to the presence of these inactive areas. Consequently, an increase in the number or width of the tabbing ribbons decreases the amount of current that can be generated by the PV module because of the increase in inactive shaded area.

To address the above concerns, PCT Publication No. WO 2013/148149 (Chen et al.), the teachings of which are incorporated herein by reference, discloses a light directing medium, in the form of a strip of microstructured film carrying a light reflective layer, applied over the tabbing ribbons. The light directing medium directs light that would otherwise be incident on an inactive area onto an active area. More particularly, the light directing medium redirects the incident light into angles that totally internally reflect (TIR) from the front-side layer; the TIR light subsequently reflects onto an active PV cell area to produce electricity. In this way, the total power output of the PV module can be increased, especially under circumstances where an arrangement of the microstructures relative to a position of the sun is relatively constant over the course of the day. However, where asymmetrical conditions are created by the PV module installation relative to a position of the sun (e.g., a non tracking PV module installation, portrait vs. landscape orientation, etc.), light reflection caused by the microstructured film may, under certain conditions, undesirably lead to some of the reflected light escaping from the PV module.

In light of the above, a need exists for a light redirecting film useful, for example, with PV modules in reflecting increased levels of incident light at angles within the critical TIR angle of the corresponding front-side layer.

SUMMARY

Some aspects of the present disclosure are directed toward a light redirecting film article. The article includes a light redirecting film having a width and a length, with the length defining a longitudinal axis. The light redirecting film typically comprises a base layer, an ordered arrangement of a plurality of microstructures, and a reflective layer. The plurality of microstructures project from the base layer. Further, each of the microstructures extends (preferably continuously, but continuity is not an absolute requirement) along the base layer to define a corresponding primary axis. Throughout the instant disclosure, when a microstructure extends along the base layer to define a corresponding primary axis, the primary axis is defined by the elongated shape of the microstructure (along the peak (e.g., 60 or 60', see, for instance., FIGS. 1A and 2). The primary axis of at least one of the microstructures is oblique with respect to the longitudinal axis (that is, the primary axis is not parallel to the longitudinal axis of the film). Finally, the reflective layer is disposed over the microstructures opposite the base layer. With this construction, the obliquely arranged, reflectorized microstructure(s) will reflect light in a unique manner relative to the longitudinal axis that differs from an on-axis arrangement (that is, an arrangement in which the primary axis of the microstructure is parallel to the longitudinal axis of the film). In some embodiments, a majority or all of the microstructures are arranged such that the corresponding primary axes are all oblique with respect to the longitudinal axis. In other embodiments, the longitudinal axis and the primary axis of at least one of the microstructures, optionally a majority or all of the microstructures, forms a bias angle with respect to the longitudinal axis in the range of 1°-90°, alternative in the range of 20°-70°, alternative in the range 70°-90°. In yet other embodiments, the light redirecting film article further includes an adhesive layer disposed on the base layer opposite the microstructures and in other embodiments the film further comprises a liner adjacent the adhesive layer as an outermost layer.

Other aspects of the present disclosure are directed toward a PV module including a plurality of PV cells electrically connected by tabbing ribbons. Further, a light redirecting film article is disposed over at least a portion of at least one of the tabbing ribbons. In other embodiments, the light redirecting film may substitute for a tabbing ribbon. In other embodiments, the light redirecting film may fill the space between or surrounding the PV cells in the PV module, or any other area that is not part of a PV cell capable of converting incident light into electricity. The light redirecting film article can have any of the constructions described above. In other embodiments, the PV module can have the light redirecting film article placed on one, all, or any combination of the locations described above (over a portion of some tabbing ribbons, replacing one or more tabbing ribbons, and/or on areas not able to covert incident light into electricity). A front-side layer (e.g., glass) is located over the PV cells and the light redirecting film article. The light redirecting film article can render the PV module to be orientation independent, exhibiting relatively equivalent annual efficiency performance with respect to electric power generation in a stationary (i.e., non-tracking) installation independent of landscape orientation or portrait orientation. In other embodiments, the light redirecting film article can enable the PV module to have superior performance in portrait orientation in a stationary (i.e., non-tracking) installation. In other embodiments, the light redirecting film article can enable the PV module to have superior performance in landscape or portrait orientation in a single axis tracking installation.

BRIEF DESCRIPTION OF THE DRAWINGS

FIG. 10A is a simplified top view of the conventional PV module of FIG. 8 in a landscape orientation;

FIG. 10B is a simplified top view of the conventional PV module of FIG. 8 in a portrait orientation;

FIG. 11A is a plot of modeled efficiency of the conventional PV module of FIG. 8 in landscape orientation at a 30° North latitude location superimposed on the conoscopic plot of FIG. 9;

FIG. 11B is a plot of modeled efficiency of the conventional PV module of FIG. 8 in portrait orientation at a 30° North latitude location superimposed on the conoscopic plot of FIG. 9;

FIG. 12A is a plot of modeled efficiency of the PV module of FIG. 6A in landscape orientation at a 30° North latitude location superimposed on the conoscopic plot of FIG. 9;

FIG. 12B is a plot of modeled efficiency of the PV module of FIG. 6A in portrait orientation at a 30° North latitude location superimposed on the conoscopic plot of FIG. 9;

FIG. 13A is a plot of modeled efficiency of the PV module of FIG. 6A in landscape orientation at a 30° North latitude location superimposed on the conoscopic plot of FIG. 9;

FIG. 13B is a plot of modeled efficiency of the PV module of FIG. 6A in portrait orientation at a 30° North latitude location superimposed on the conoscopic plot of FIG. 9;

FIG. 16A is a ray trace diagram showing the calculated light redirecting properties of the Comparative Example comprising LRF T80 film;

FIG. 16B is a diagram showing the measured light redirection properties of the comparative example comprising LRF T80 film;

FIG. 17A is a ray trace diagram showing the calculated light redirecting properties of Example 1;

FIG. 17B is a diagram showing the measured light redirection properties of Example 1;

DETAILED DESCRIPTION

Aspects of the present disclosure provide light redirecting films and light redirecting film articles. The light redirecting films (sometimes referred to as reflective films or light directing mediums) of the present disclosure can generally include reflective surface-bearing microstructures that are arranged at an oblique or biased angle relative to a lengthwise or longitudinal axis of the film. The light redirecting films and light redirecting film articles of the present disclosure have multiple end-use applications, and in some embodiments are useful with PV modules as described below. However, the present disclosure is not limited to PV modules.

As used herein, the term "ordered arrangement" when used to describe microstructural features, especially a plurality of microstructures, means an imparted pattern different from natural surface roughness or other natural features, where the arrangement can be continuous or discontinuous, can include a repeating pattern, a non-repeating pattern, a random pattern, etc.

As used herein, the term "microstructure" means the configuration of features wherein at least 2 dimensions of the feature are microscopic. The topical and/or cross-sectional view of the features must be microscopic.

As used herein, the term "microscopic" refers to features of small enough dimension so as to require an optic aid to the naked eye when viewed from any plane of view to determine its shape. One criterion is found in Modern Optic Engineering by W. J. Smith, McGraw-Hill, 1966, pages 104-105 whereby visual acuity, " . . . is defined and measured in terms of the angular size of the smallest character that can be recognized." Normal visual acuity is considered to be when the smallest recognizable letter subtends an angular height of 5 minutes of arc of the retina. At a typical working distance of 250 mm (10 inches), this yields a lateral dimension of 0.36 mm (0.0145 inch) for this object.

Light Redirecting Film Article

Figure 1A:
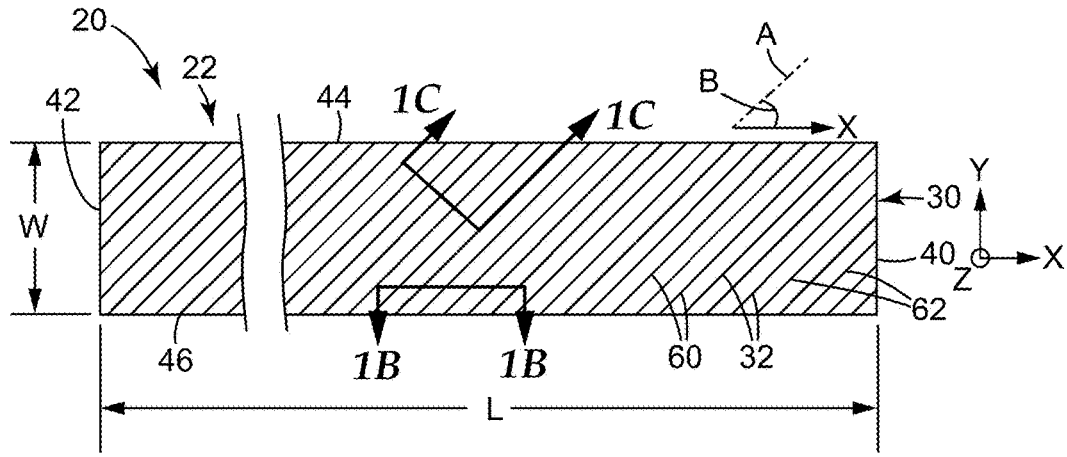
FIG. 1A is a simplified top plan view of a light redirecting film article in accordance with principles of the present disclosure.
Figure 1B:
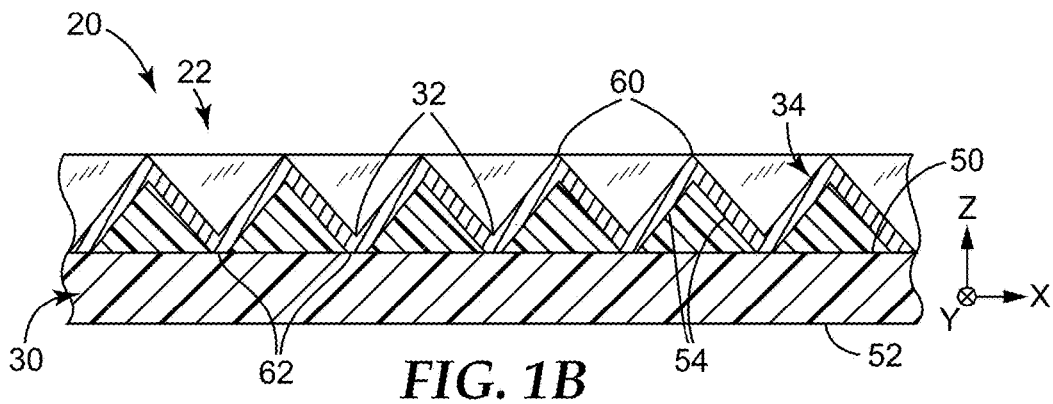
FIG. 1B is an enlarged cross-sectional view of a portion of the article of FIG. 1A, taken along the line 1B-1B.
Figure 1C:
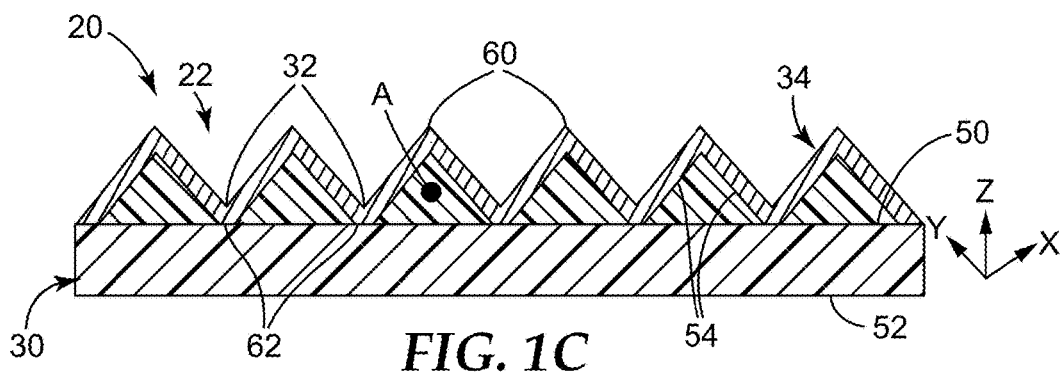
FIG. 1C is an enlarged cross-sectional view of a portion of the article of FIG. 1A, taken along the line 1C-1C.

One embodiment of a light redirecting film article 20 in accordance with principles of the present disclosure is shown in FIGS. 1A-1C. The light redirecting film article 20 comprises a light redirecting film 22 having a base layer 30, an ordered arrangement of a plurality of microstructures 32, and a reflective layer 34. As a point of reference, features of the microstructures 32 can be described with respect to a longitudinal axis of the light redirecting film 22. In this regard, the light redirecting film 22 can be provided as an elongated strip having or defining a length L and a width W. For example, in some embodiments, the strip of light redirecting film 22 terminates at opposing end edges 40, 42 and opposing side edges 44, 46. The length L of the light redirecting film 22 is defined as the linear distance between the opposing end edges 40, 42, and the width W as the linear distance between the opposing side edges 44, 46. The length L is greater than the width W (e.g., on the order of at least ten times greater). The longitudinal axis of the light redirecting film 22 is defined in the direction of the length L, and is identified as the "X-axis" in FIG. 1A. A lateral axis (or Y-axis in FIG. 1A) is defined in the direction of the width W. In some embodiments, the longitudinal (X) and lateral (Y) axes can also be viewed as the web (or machine) and cross-web axes or directions, respectively, in accordance with accepted film manufacture conventions.

As best shown in FIGS. 1B and 1C, in one embodiment of the light redirecting film article, the base layer 30 has opposing, first and second major faces 50, 52, and each of the microstructures 32 projects from the first major face 50 to a height (Z-axis) of 5-500 micrometers is some embodiments. A shape of each of the microstructures 32 can be substantially prismatic (e.g., within 10% of a true prism), for example the substantially triangular prism shape shown (e.g., a "roof" prism, although other prismatic shapes are also acceptable), and defines at least two facets 54. Throughout the instant disclosure, a "substantially triangular prism shape" refers to a prism shape having a cross-sectional area that is 90% to 110% of the area of largest inscribed triangle in the corresponding cross-sectional area of the prism. Regardless, a shape of each of the microstructures 32 terminates or defines a peak 60 opposite the base layer 30. In some embodiments, the peak 60 can define an apex angle of about 120 degrees (e.g., plus or minus 5 degrees) for the shape of the corresponding microstructure 32. While the peak 60 of each of the microstructures 32 is shown in FIGS. 1B and 1C as being a sharp corner for ease of illustration, in other embodiments, one or more of the peaks 60 can be rounded for reasons made clear below. The peaks 60 (and valleys 62 between immediately adjacent microstructures 32) are also generally illustrated in the simplified top view of FIG. 1A that otherwise reflects that the microstructures 32 extend continuously across the base layer 30 (it being understood that in the view of FIG. 1A, although the base layer 30 is generally identified, the base layer 30 is effectively "behind" the plurality of microstructures 32). In this embodiment, the microstructures extend continuously, but other embodiments do not necessarily need to meet this requirement.

Figure 2:
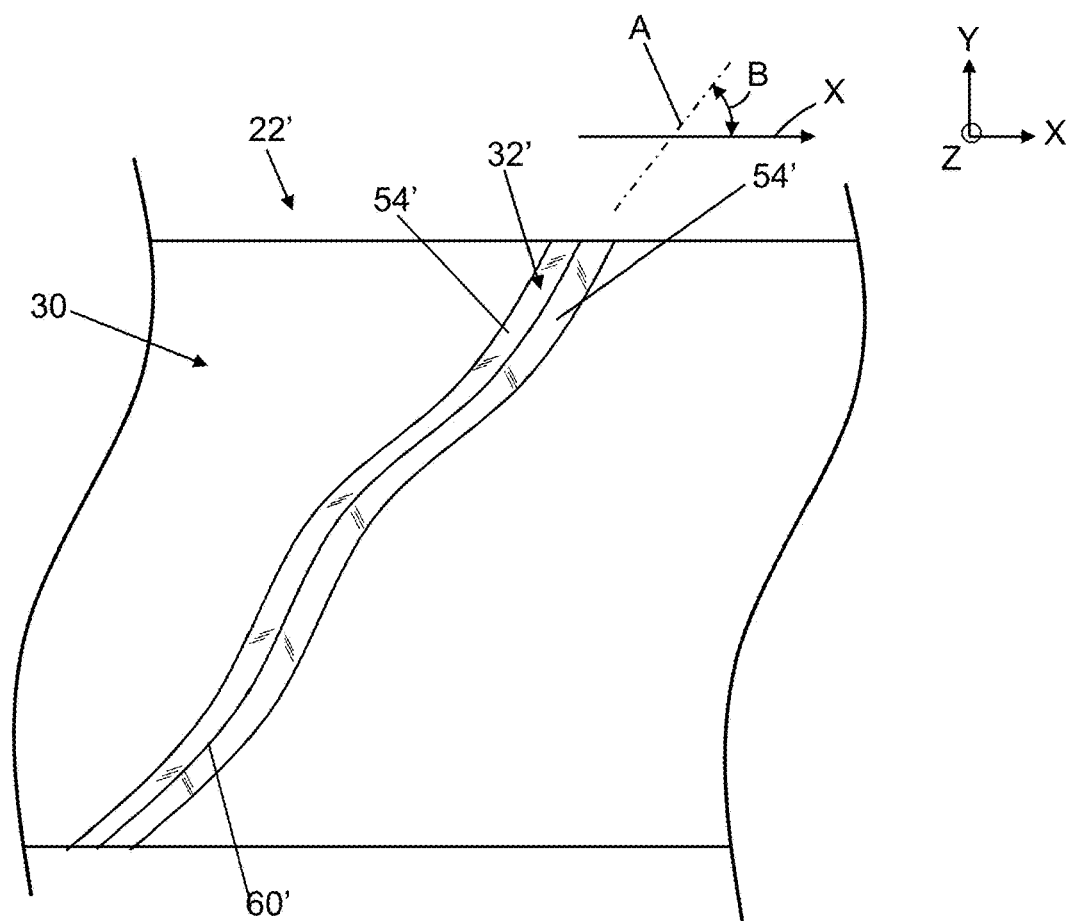
FIG. 2 is a greatly simplified top plan view of a portion of another light redirecting film useful with articles of the present disclosure.

The continuous, elongated shape establishes a primary axis A for each of the microstructures 32 (i.e., each individual microstructure has a primary axis). It will be understood that the primary axis A of any particular one of the microstructures 32 may or may not bisect a centroid of the corresponding cross-sectional shape at all locations along the particular microstructure 32. Where a cross-sectional shape of the particular microstructure 32 is substantially uniform (i.e., within 5% of a truly uniform arrangement) in complete extension across the base layer 30, the corresponding primary axis A will bisect the centroid of the cross-sectional shape at all locations along a length thereof. Conversely, where the cross-sectional shape is not substantially uniform in extension across the base layer 30 (as described in greater detail below), the corresponding primary axis A may not bisect the centroid of the cross-sectional shape at all locations. For example, FIG. 2 is a simplified top view of an alternative light redirecting film 22', and generally illustrates another microstructure 32' configuration in accordance with principles of the present disclosure. The microstructure 32' has a "wavy" shape in extension across the base layer 30, with variations in one or more of the facets 54' and the peak 60'. The primary axis A generated by the elongated shape of the microstructure 32' is also identified, and is oblique with respect to the longitudinal axis X of the light redirecting film 22'. In more general terms, then, and returning to FIGS. 1A-1C, the primary axis A of any particular one of the microstructures 32 is a straight line that is a best fit with a centroid of the elongated shape in extension across the base layer 30.

The microstructures 32 can be substantially identical with one another (e.g., within 5% of a truly identical relationship) in terms of at least shape and orientation, such that all of the primary axes A are substantially parallel to one another (e.g., within 5% of a truly parallel relationship). Alternatively, in other embodiments, some of the microstructures 32 can vary from others of the microstructures 32 in terms of at least one of shape and orientation, such that one or more of the primary axes A may not be substantially parallel with one or more other primary axes A. Regardless, the primary axis A of at least one of the microstructures 32 is oblique with respect to the longitudinal axis X of the light redirecting film 22. In some embodiments, the primary axis A of at least a majority of the microstructures 32 provided with the light redirecting film 22 is oblique with respect to the longitudinal axis X; in yet other embodiments, the primary axis A of all of the microstructures 32 provided with the light redirecting film 22 is oblique with respect to the longitudinal axis X. Alternatively stated, the angle between the longitudinal axis X and the primary axis A of at least one of the microstructures 32 define a bias angle B, as shown in FIG. 2. The bias angle B is in the range of 1°-90°, alternatively in the range of 20°-70°, alternatively in the range of 70°-90°. It should be noted the bias angle B can be measured clockwise from the axis X or anti-clockwise from the axis X. The discussion throughout this application describes positive bias angles for simplicity. Bias angles of □, −B, (m*180°+□), and −(m*180°−B) where m is an integer are part of this disclosure. For example, a bias angle □ of 80° can also be described as a bias angle B of −120°. In other embodiments, the bias angle B is about 45° (e.g., plus or minus 5°). In other embodiments, for example in embodiments in which the PV module is in the portrait orientation, the bias angle B is from 65° to 90°, or from 70° to 90°, or from 75° to 90°, or from 75° to 85°, or from 80° to 90°, or from 80° to 85°, or 74°, or 75°, or 76°, or 77°, or 78°, or 79°, or 80°, or 81°, or 82°, or 83°, or 84°, or 85°, or 86°, or 87°, or 88°, or 89°, or 90°. In some embodiments, the bias angle B about 82° (e.g., plus or minus 8°). In some embodiments, the primary axis A of at least a majority of the microstructures 32 provided with the light redirecting film 22 combine with the longitudinal axis X to define the bias angle B as described above; in yet other embodiments, the primary axis A of all of the microstructures 32 provided with the light redirecting film 22 combine with the longitudinal axis X to define the bias angle B as described above. In this regard, the bias angle B can be substantially identical (e.g., within 5% of a truly identical relationship) for each of the microstructures 32, or at least one of the microstructures 32 can establish the bias angle B that differs from the bias angle B of others of the microstructures 32 (with all the bias angles B being within the range(s) set forth above). As described below, the oblique or biased arrangement of one or more of the microstructures 32 relative to the longitudinal axis X renders the light redirecting film 22 well-suited for use with PV modules as described below.

The reflective layer 34 uniformly covers or forms an outer face of each of the microstructures 32. Thus, the reflective layer 34 mimics the shape of the microstructures 32, providing reflective surfaces (e.g., corresponding with the facets 54) that are arranged oblique or biased relative to the longitudinal axis X for at least some, optionally all, of the microstructures 32 commensurate with the descriptions above. The combination microstructure 32 and reflective layer 34 can be referred to as a "reflectorized microstructure" or "reflectorized prism" in some embodiments. Further, light redirecting films and articles of the present disclosure having one or more reflectorized microstructures with a primary axis A oblique to the longitudinal axis X as described above are also referred to as "biased angle light redirecting films".

The base layer 30 comprises a material. In some embodiments base layer 30 comprises a polymer. In other embodiments, base layer 30 comprises a conductive material. A wide range of polymeric materials are suitable for preparing the base layer 30. Examples of suitable polymeric materials include cellulose acetate butyrate; cellulose acetate propionate; cellulose triacetate; poly(meth)acrylates such as polymethyl methacrylate; polyesters such as polyethylene terephthalate and polyethylene naphthalate; copolymers or blends based on naphthalene dicarboxylic acids; polyether sulfones; polyurethanes; polycarbonates; polyvinyl chloride; syndiotactic polystyrene; cyclic olefin copolymers; silicone-based materials; and polyolefins including polyethylene and polypropylene; and blends thereof. Particularly suitable polymeric materials for the base layer 30 are polyolefins and polyesters. A wide range of conductive materials are suitable for preparing base layer 30. Examples of suitable conductive materials include but are not limited to copper wires, copper foils, aluminum wire, aluminum foils, and polymers containing conductive particles.

In some embodiments, the microstructures 32 may comprise a polymeric material. In some embodiments, the polymeric material of the microstructures 32 is the same composition as the base layer 30. In other embodiments, the polymeric material of the microstructures 32 is different from that of the base layer 30. In some embodiments, the base layer 30 material is a polyester and the microstructure 32 material is a poly(meth)acrylate. In other embodiments, the microstructures 32 may also comprise conductive materials that are the same or different than the base layer 30.

The reflective layer 34 can assume various forms appropriate for reflecting light, such as metallic, inorganic materials or organic materials. In some embodiments, the reflective layer 34 is a mirror coating. The reflective layer 34 can provide reflectivity of incident sunlight and thus can prevent some of the incident light from being incident on the polymer materials of the microstructures 32. Any desired reflective coating or mirror coating thickness can be used, for example on the order of 30-100 nm, optionally 35-60 nm. Some exemplary thicknesses are measured by optical density or percent transmission. Obviously, thicker coatings prevent more UV light from progressing to the microstructures 32. However, coatings or layers that are too thick may cause increased stress within the layer, leading to undesirable cracking. When a reflective metallic coating is used for the reflective layer 34, the coating is typically silver, aluminum, tin, tin alloys, or a combination thereof. Aluminum is more typical, but any suitable metal coating can be used. Generally, the metallic layer is coated by vapor deposition, using well understood procedures. The use of a metallic layer may require an additional coating to electrically insulate the light redirecting film article from electrical components in the PV module. Some exemplary inorganic materials include (but are not limited to) oxides (e.g., $SiO_2$, $TiO_2$, $Al_2O_3$, $Ta_2O_5$, etc.) and fluorides (e.g., $MgF_2$, $LaF_3$, $AlF_3$, etc.) that can be formed into alternating layers to provide a reflective interference coating suitable for use as a broadband reflector. Unlike metals, these layered reflectors may allow wavelengths non-beneficial to a PV cell, for example, to transmit. Some exemplary organic materials include (but are not limited to) acrylics and other polymers that may also be formed into layered interference coatings suitable for use as a broadband reflector. The organic materials can be modified with nanoparticles or used in combination with inorganic materials.

Figure 3:
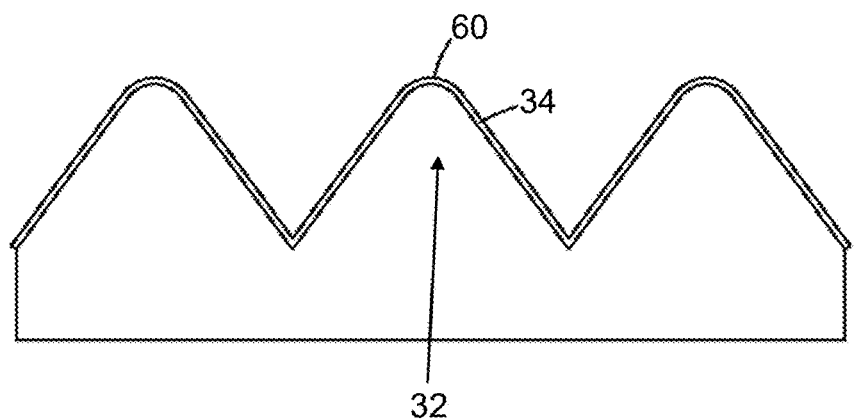
FIG. 3 is a simplified side view of a portion of another light redirecting film useful with articles of the present disclosure.

With embodiments in which the reflective layer 34 is provided as a metallic coating (and optionally with other constructions of the reflective layer 34), the microstructures 32 can be configured such that the corresponding peaks 60 are rounded, as alluded to above. One non-limiting example of the rounded peak construction is shown in FIG. 3. Depositing a layer of metal (i.e., the reflective layer 34) on rounded peaks is easier than depositing on sharp peaks. Also, when the peaks 60 are sharp (e.g., come to a point), it can be difficult to adequately cover the sharp peak with a layer of metal. This can, in turn, result in a "pinhole" at the peak 60 where little or no metal is present. These pinholes not only do not reflect light, but also may permit passage of sunlight to the polymeric material of the microstructure 32, possibly causing the microstructure 32 to degrade over time. With the optional rounded peak constructions, the peak 60 is easier to coat and the risk of pinholes is reduced or eliminated. Further, rounded peak films can be easy to handle and there are no sharp peaks present that might otherwise be vulnerable to damage during processing, shipping, converting or other handling steps.

Returning to FIGS. 1A-1C, in some embodiments, construction of the light redirecting film 22 generally entails imparting microstructures into a film. With these embodiments, the base layer 30 and the microstructures 32 comprise the same polymeric composition. In other embodiments, the microstructures 32 are prepared separately (e.g., as a microstructured layer) and laminated to the base layer 30. This lamination can be done using heat, a combination of heat and pressure, or through the use of an adhesive. In still other embodiments, the microstructures 32 are formed on the base layer 30 by means of crimping, knurling, embossing, extrusion or the like. In other embodiments, formation of the microstructures 32 apart from the base layer 30 can be done by microreplication.

One manufacturing technique conducive to microreplicating the microstructures 32 oblique to the longitudinal axis X (e.g., at a selected bias angle B) is to form the microstructures 32 with an appropriately constructed microreplication molding tool (e.g., a workpiece or roll) apart from the base layer 30. For example, a curable or molten polymeric material could be cast against the microreplication molding tool and allowed to cure or cool to form a microstructured layer in the molding tool. This layer, in the mold, could then be adhered to a polymeric film (e.g., the base layer 30) as described above. In a variation of this process, the molten or curable polymeric material in the microreplication molding tool could be contacted to a film (e.g., the base layer 30) and then cured or cooled. In the process of curing or cooling, the polymeric material in the microreplication molding tool can adhere to the film. Upon removal of the microreplication molding tool, the resultant construction comprises the base layer 30 and the projecting microstructures 32. In some embodiments, the microstructures 32 (or microstructured layer) are prepared from a radiation curable material, such as (meth)acrylate, and the molded material (e.g., (meth)acrylate) is cured by exposure to actinic radiation.

An appropriate microreplication molding tool can be formed by a fly-cutting system and method, examples of which are described in U.S. Pat. No. 8,443,704 (Burke et al.) and U.S. Application Publication No. 2009/0038450 (Campbell et al.), the entire teachings of each of which are incorporated herein by reference. Typically, in fly-cutting, a cutting element is used, such as a diamond, that is mounted on or incorporated into a shank or tool holder that is positioned at the periphery of a rotatable head or hub, which is then positioned relative to the surface of the workpiece into which grooves or other features are to be machined. Fly-cutting is a discontinuous cutting operation, meaning that each cutting element is in contact with the workpiece for a period of time, and then is not in contact with the workpiece for a period of time during which the fly-cutting head is rotating that cutting element through the remaining portion of a circle until it again contacts the workpiece. The techniques described in the '704 patent and the '450 Publication can form microgrooves in a cylindrical workpiece or microreplication molding tool at an angle relative to a central axis of the cylinder; the microgrooves are then desirably arranged to generate biased or oblique microstructures relative to the longitudinal axis of a film traversing the cylinder in a tangential direction in forming some embodiments of the light redirecting films and articles of the present disclosure. The fly-cutting techniques (in which discrete cutting operations progressively or incrementally form complete microgrooves) may impart slight variations into one or more of the faces of the microgrooves along a length thereof; these variations will be imparted into the corresponding face or facet 54 of the microstructures 32 generated by the microgrooves, and in turn by the reflective layer 34 as applied to the microstructures 32. Light incident on the variations is diffused. As described in greater detail below, this optional feature may beneficially improve performance of the light redirecting film 22 as part of a PV module construction.

Figure 4:
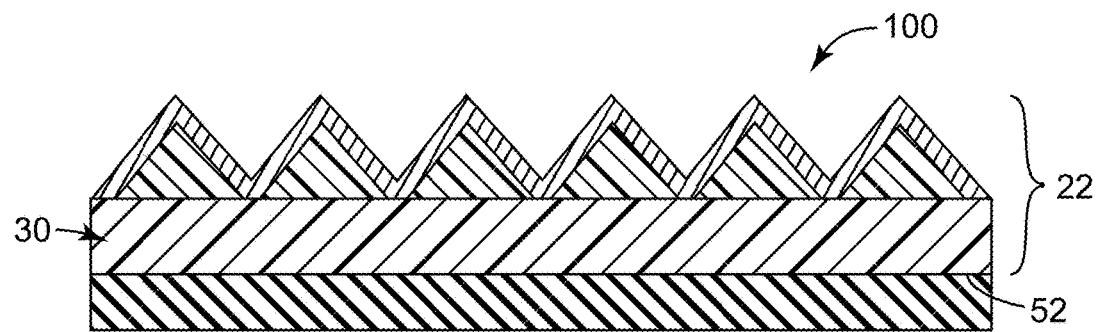
FIG. 4 is an enlarged cross-sectional view of a portion of another light redirecting film article in accordance with principles of the present disclosure.

Another embodiment light redirecting film article 100 in accordance with principles of the present disclosure is shown in FIG. 4. The article 100 includes the light redirecting film 22 as described above along with an adhesive layer 102 applied (e.g., coated) to the second major face 52 of the base layer 30. The adhesive layer 102 can assume various forms. For example, the adhesive of the adhesive layer 102 can be a hot-melt adhesive such as an ethylene vinyl acetate polymer (EVA). Other types of suitable hot-melt adhesives include polyolefins. In other embodiments, the adhesive of the adhesive layer 102 is a pressure sensitive adhesive (PSA). Suitable types of PSAs include, but are not limited to, acrylates, silicones, polyisobutylenes, ureas, and combinations thereof. In some embodiments, the PSA is an acrylic or acrylate PSA. As used herein, the term "acrylic" or "acrylate" includes compounds having at least one of acrylic or methacrylic groups. Useful acrylic PSAs can be made, for example, by combining at least two different monomers (first and second monomers). Exemplary suitable first monomers include 2-methylbutyl acrylate, 2-ethylhexyl acrylate, isooctyl acrylate, lauryl acrylate, n-decyl acrylate, 4-methyl- 2-pentyl acrylate, isoamyl acrylate, sec-butyl acrylate, and isononyl acrylate. Exemplary suitable second monomers include a (meth)acrylic acid (e.g., acrylic acid, methacrylic acid, itaconic acid, maleic acid, and fumaric acid), a (meth) acrylamide (e.g., acrylamide, methacrylamide, N-ethyl acrylamide, N-hydroxyethyl acrylamide, N-octyl acrylamide, N-t-butyl acrylamide, N,N-dimethyl acrylamide, N,Ndiethyl acrylamide, and N-ethyl-N-dihydroxyethyl acrylamide), a (meth)acrylate (e.g., 2-hydroxyethyl acrylate or methacrylate, cyclohexyl acrylate, t-butyl acrylate, or isobornyl acrylate), N-vinyl pyrrolidone, N-vinyl caprolactam, an alphaolefin, a vinyl ether, an allyl ether, a styrenic monomer, or a maleate. Acrylic PSAs may also be made by including cross-linking agents in the formulation.

In some embodiments, the adhesive layer 102 can be formulated for optimal bonding to an expected end-use surface (e.g., tabbing ribbon of a PV module). Though not shown, the light redirecting film article 100 can further include a release liner as known in the art disposed on the adhesive layer 102 opposite the light redirecting film 22. Where provided, the release liner protects the adhesive layer 102 prior to application of the light redirecting film article 100 to a surface (i.e., the release liner is removed to expose the adhesive layer 102 for bonding to an intended end-use surface).

Figure 5:
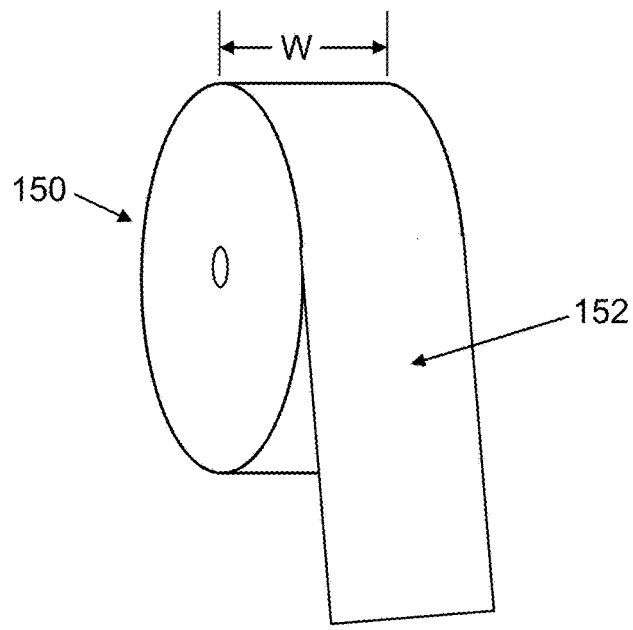
FIG. 5 is a perspective view of another light redirecting film article in accordance with principles of the present disclosure and provided in a rolled form.

The light redirecting film articles 20, 100 of the present disclosure can be provided in various widths and lengths. In some embodiments, the light redirecting film article can be provided in a roll format, as represented by roll 150 in FIG. 5. The roll 150 can have various widths W appropriate for an expected end-use application. For example, with some embodiments useful with PV module end-use applications, the light redirecting film article 152 of the roll 150 can have a width W of not more than about 15.25 cm (6 inches) in some embodiments, or of not more than 7 mm in some embodiments. Commensurate with the above descriptions, the primary axis of the microstructures (not shown) provided with the light redirecting film article 152 are oblique with respect to the width W (and the wound length thereof).

PV Modules

Figure 6A:
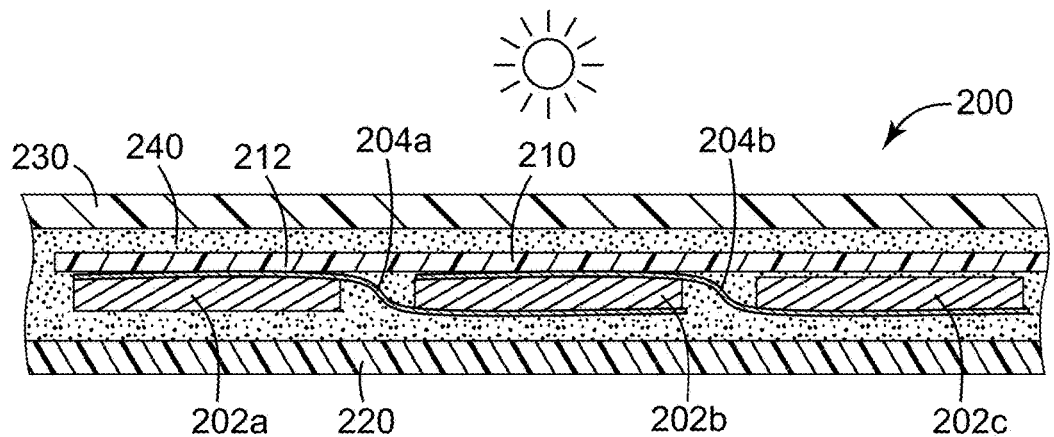
FIG. 6A is a simplified cross-sectional view of a portion of a PV module in accordance with principles of the present disclosure.

The light redirecting film articles of the present disclosure have multiple end use applications. In some embodiments, aspects of the present disclosure relate to use of the light redirecting films as part of a PV or solar module. For example, FIG. 6A is a cross-sectional view of a portion of one exemplary embodiment of a PV module 200 according to the present disclosure. The PV module 200 includes a plurality of rectangular PV cells 202a, 202b, 202c. Any PV cell format can be employed in the PV modules of the present disclosure (e.g., thin film photovoltaic cells, CuInSe$_2$ cells, a-Si cells, e-Si sells, and organic photovoltaic devices, among others). The light redirecting film article is shown as element 210. A metallization pattern is applied to the PV cells, most commonly by screen printing of silver inks. This pattern consists of an array of fine parallel gridlines, also known as fingers (not shown). Exemplary PV cells include those made substantially as illustrated and described in U.S. Pat. No. 4,751,191 (Gonsiorawski et al), U.S. Pat. No. 5,074,921 (Gonsiorawski et al), U.S. Pat. No. 5,118,362 (St. Angelo et al), U.S. Pat. No. 5,320,684 (Amick et al) and U.S. Pat. No. 5,478,402 (Hanoka), each of which is incorporated herein in its entirety. Electrical connectors or tabbing ribbons 204 (e.g., referenced generally in FIG. 7A; or in FIG. 6A and identified as 204a and 204b) are disposed over and typically soldered to the PV cells, to collect current from the fingers. In some embodiments, the electrical connectors 204 are provided in the form of coated (e.g., tinned) copper wires. Although not shown, it is to be understood that in some embodiments, each PV cell includes a rear contact on it rear surface.

Figure 6B:
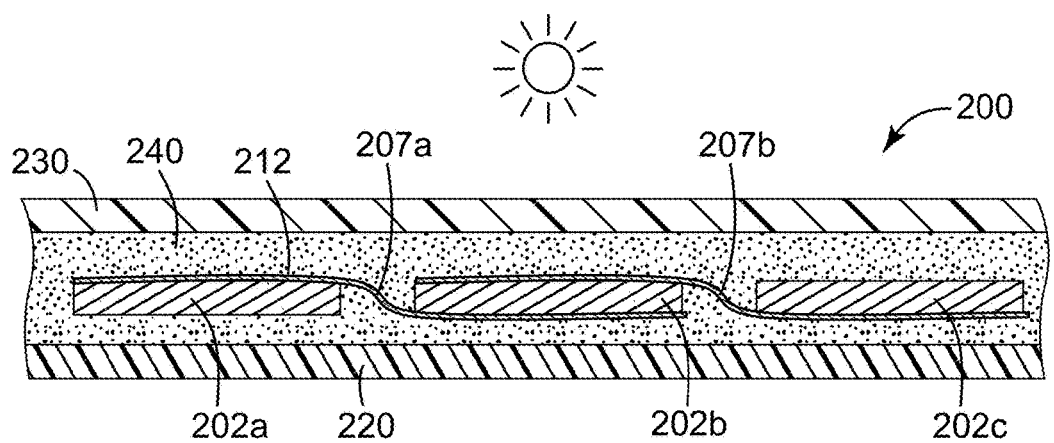
FIG. 6B is a simplified cross-sectional view of a portion of a PV module in accordance with principles of the present disclosure.

In other embodiments, a light redirecting film article that includes a conductive substrate may replace the electrical connectors 204. In that embodiment the light redirecting film article is disposed over and soldered to the PV cells, to collect electrical current from the fingers while including light redirecting properties. For example, FIG. 6B is a cross-sectional view of a portion of one PV module 200 comprising such conductive light redirecting film article. The PV module 200 includes a plurality of rectangular PV cells 202a, 202b, 202c. As with FIG. 6A, any PV cell format can be employed in the PV modules of the present disclosure (e.g., thin film photovoltaic cells, CuInSe2 cells, a-Si cells, e-Si sells, and organic photovoltaic devices, among others). The embodiment shown in FIG. 6B is similar to that in FIG. 6A, but in the embodiment of FIG. 6B, the tabbing ribbons identified as 207a and 207b comprise reflectorized microstructures and there is no light redirecting film as a separate element in the module. The upper surface of electrical connectors 207 are formed in a way as to contain microstructures as described in this disclosure thus performing both light redirecting and electrical connection functions.

A strip of a light redirecting film article 210 is applied over at least a portion of at least one of the electrical connectors 204 as described in greater detail below. The light redirecting film article 210 can have any of the forms described above. In some embodiments, the light redirecting film article 210 is bonded to the corresponding electrical connector 204 by an adhesive 212 (referenced generally). The adhesive 212 can be a component of the light redirecting film article 210 (e.g., the light redirecting film article 100 described above with respect to FIG. 4). In other embodiments, the adhesive 212 (e.g., thermally-activated adhesive, pressure sensitive adhesive, etc.) is applied over the electrical connector(s) 204 prior to application of the strip(s) of light redirecting film article 210. Though not shown, an additional strip of the light redirecting film article 210 can be applied to other regions of the PV module 200, such as between two or more of the PV cells, around the perimeter of one or more of the PV cells, etc.

The PV module 200 also includes a back protector member, often in the form of a backsheet 220. In some embodiments, the backsheet 220 is an electrically insulating material such as glass, a polymeric layer, a polymeric layer reinforced with reinforcing fibers (e.g., glass, ceramic or polymeric fibers), or a wood particle board. In some embodiments, the backsheet 220 includes a type of glass or quartz. The glass can be thermally tempered. Some exemplary glass materials include soda-lime-silica based glass. In other embodiments, the backsheet 220 is a polymeric film, including a multilayer polymer film One commercially available example of a backsheet is available under the trade designation 3M™ Scotchshield™ film from 3M Company of St. Paul, Minn. Other exemplary constructions of the backsheet 220 are those that include extruded PTFE. The backsheet 220 may be connected to a building material, such as a roofing membrane (e.g., in building integrated photovoltaics (BIPV)). In other embodiments, a portion of or the entire back protective member may include the function of the light redirecting film article such that when the PV cells are laminated with an encapsulant and a backsheet, any gaps between adjacent PV cells or at the perimeter of the PV cells reflect incident light, which can be used for energy generation. In this manner, any area on the module that receives incident light but without a PV cell may be better utilized for light collection.

In FIGS. 6A and 6B, overlying the PV cells 202a-202c is a generally planar light transmitting and electrically non-conducting front-side layer 230, which also provides support to the PV cells 202a-202c. In some embodiments, the front-side layer 230 includes a type of glass or quartz. The glass can be thermally tempered. Some exemplary glass materials include soda-lime-silica based glass. In some embodiments, the front-side layer 230 has a low iron content (e.g., less than about 0.10% total iron, more preferably less than about 0.08, 0.07 or 0.06% total iron) and/or an antireflection coating thereon to optimize light transmission. In other embodiments, the front-side layer 230 is a barrier layer. Some exemplary barrier layers are those described in, for example, U.S. Pat. No. 7,186,465 (Bright), U.S. Pat. No. 7,276,291 (Bright), U.S. Pat. No. 5,725,909 (Shaw et al), U.S. Pat. No. 6,231,939 (Shaw et al), U.S. Pat. No. 6,975,067 (McCormick et al), U.S. Pat. No. 6,203,898 (Kohler et al), U.S. Pat. No. 6,348,237 (Kohler et al), U.S. Pat. No. 7,018,713 (Padiyath et al), and U.S. Publication Nos. 2007/0020451 and 2004/0241454, all of which are incorporated herein by reference in their entirety.

In some embodiments, interposed between the backsheet 220 and the front-side layer 230 is an encapsulant 240 that surrounds the PV cells 202a-202c and the electrical connectors 204. The encapsulant is made of suitable light-transparent, electrically non-conducting material. Some exemplary encapsulants include curable thermosets, thermo-settable fluoropolymers, acrylics, ethylene vinyl acetate (EVA), polyvinyl butryral (PVB), polyolefins, thermoplastic urethanes, clear polyvinylchloride, and ionmers. One exemplary commercially available polyolefin encapsulant is available under the trade designation PO8500™ from 3M Company of St. Paul, Minn. Both thermoplastic and thermoset polyolefin encapsulants can be used.

The encapsulant 240 can be provided in the form of discrete sheets that are positioned below and/or on top of the array of PV cells 202a-202c, with those components in turn being sandwiched between the backsheet 220 and the front-side layer 230. Subsequently, the laminate construction is heated under vacuum, causing the encapsulant sheets to become liquefied enough to flow around and encapsulate the PV cells 202a-202c, while simultaneously filling any voids in the space between the backsheet 220 and the front-side layer 230. Upon cooling, the liquefied encapsulant solidifies. In some embodiments, the encapsulant 240 may additionally be cured in situ to form a transparent solid matrix. The encapsulant 240 adheres to the backsheet 220 and the front-side layer 230 to form a laminated subassembly.

With the general construction of the PV module 200 in mind, FIG. 6A reflects that the first PV cell 202a is electrically connected to the second PV cell 202a by a first electrical connector or tabbing ribbon 204a. The first electrical connector 204a extends across the entire length of and over the first PV cell 202a, extending beyond the edge of the first PV cell 202a, and bending down and under the second PV cell 202b. The first electrical connector 204a then extends across the entire length of and underneath the second PV cell 202b. A similar relationship is established by a second electrical connector or tabbing ribbon 204b relative to the second and third PV cells 202b, 202c, as well as by additional electrical connectors relative to adjacent pairs of additional PV cells provided with the PV module 200. FIG. 6B shows a similar relationship between the light redirecting/tabbing ribbon elements 207a and 207b and the PV cells 202a, 202b, and 202c being connected by such elements.

Figure 7A:
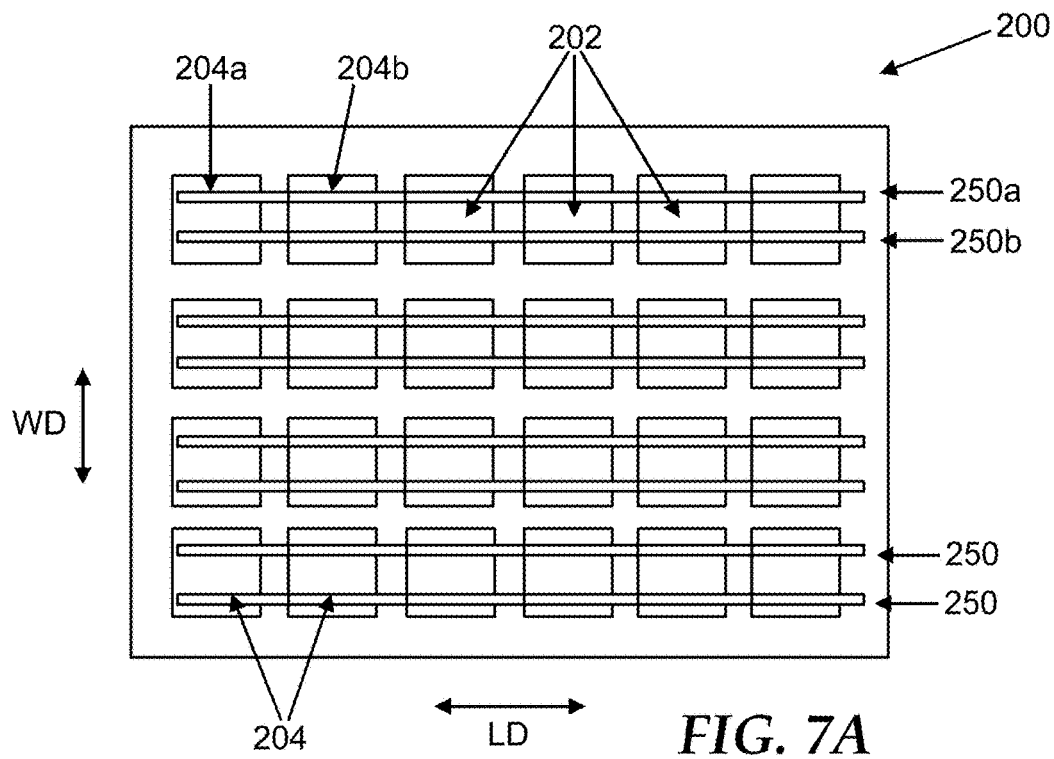
FIG. 7A is a simplified top plan view of the PV module of FIG. 6A at an intermediate stage of manufacture.

FIG. 7A is a simplified top view representation of the PV module 200 during an intermediate stage of manufacture and prior to application of the light redirecting film article(s) 210. The array of PV cells 202 generates a length direction LD and a width direction WD, with various tabbing ribbons 204 being aligned in the length direction LD (e.g., FIG. 7A identifies the first and second electrical connectors 204a, 204b described above) to collectively establish tabbing ribbon lines 250 (referenced generally). With additional reference to FIG. 7B, strips of the light redirecting film article 210 can be applied along respective tabbing ribbon lines 250, completely overlapping the corresponding electrical connectors 204 (e.g., a first strip of light redirecting film article 210a extends along a first tabbing ribbon line 250a covering the first and second tabbing ribbons 204a, 204b, and all other tabbing ribbons of the first tabbing ribbon line 250a; a second strip of light redirecting film article 210b extends along a second tabbing ribbon line 250b; etc.). With this exemplary construction, each strip of the light redirecting film article 210 optionally extends continuously across a length of the PV module 200. As mentioned before, in some embodiments, the light redirecting film article 210 can be applied to other inactive regions of the PV module 200, such as between adjacent ones of the PV cells 202, around a perimeter of one or more of the PV cells 202, etc. In related embodiments, differently formatted versions (in terms of at least bias angle B) of the light redirecting film articles of the present disclosure can be utilized in different inactive regions of the PV module 200. For example, the bias angle B of the light redirecting film article arranged so as to extend in the length direction LD (e.g., between two immediately adjacent ones of the PV cells 202) can be different from that of a light redirecting film article arranged to extend in the width direction WD (e.g., between another two immediately adjacent PV cells 202).

Figure 7B:
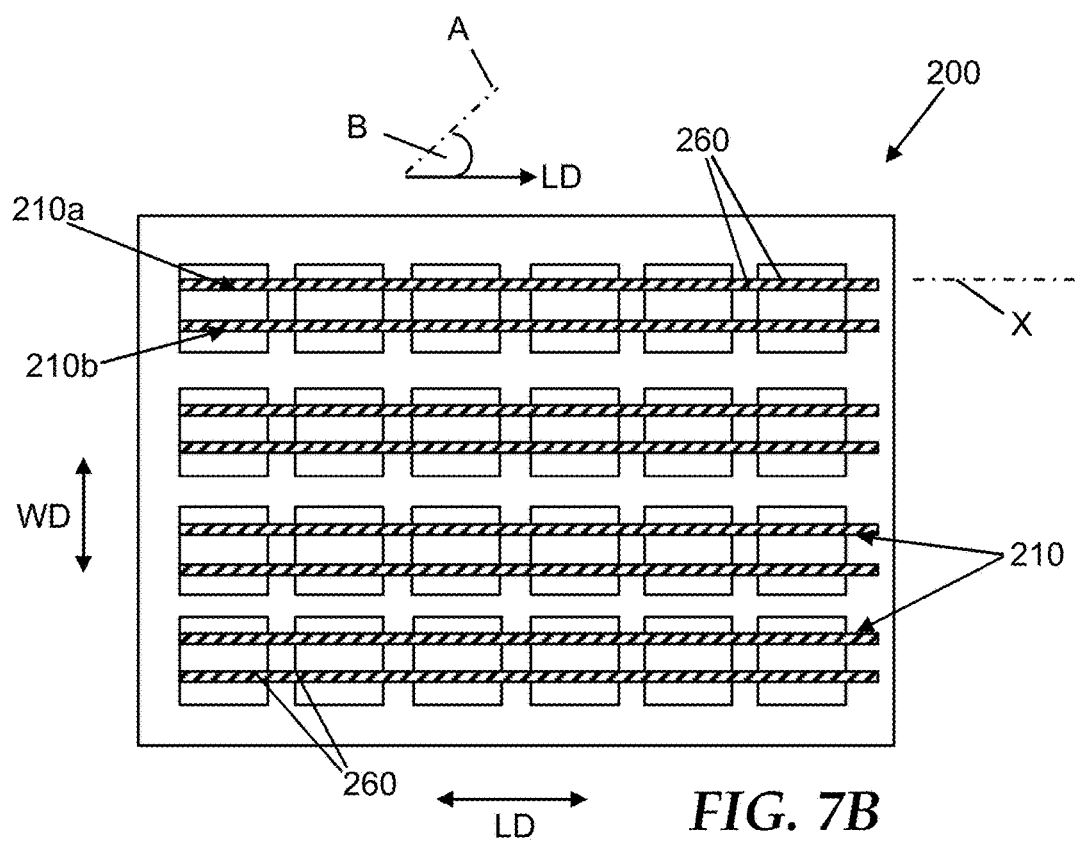
FIG. 7B is a simplified top plan view of the PV module of FIG. 7A at a later stage of manufacture.

FIG. 7B further illustrates, in greatly exaggerated form, reflectorized microstructures 260 provided with each of the strips of the light redirecting film articles 210 commensurate with the above descriptions. In some exemplary embodiments, the reflectorized microstructures 260 are identically formed along at least one of the light redirecting film articles 210, with the primary axis A of all the reflectorized microstructures 260 being substantially parallel and oblique with respect to the corresponding longitudinal axis X of the light redirecting film article 210. By way of example, reflectorized microstructures 260 of the first light redirecting film article 210a identified in FIG. 7B are oblique to the longitudinal axis X of the first light redirecting film article 210a. The first light redirecting film article 210a is applied in the lengthwise direction LD, such that the longitudinal axis X of the first light directing film article 210a is parallel with the length direction LD of the PV module 200; thus, the primary axis A of each of the reflectorized microstructures 260 of the first light redirecting film article 210a is also oblique with respect to the length direction LD. Because the longitudinal axis X and the length direction LD are parallel, the bias angle B described above also exists relative to the length direction LD. In other words, upon final assembly, the primary axis A of one or more or all of the reflectorized microstructures 260 of the first light directing film article 210a combine or intersect with the length direction LD to establish the bias angle B as described above; the bias angle B can be on the order of 45° (plus or minus 5°) in some non-limiting embodiments. In other embodiments, for example in embodiments in which the PV module is in the portrait orientation, the bias angle B is from 65° to 90°, or from 70° to 90°, or from 75° to 90°, or from 80° to 90°, or from 80° to 85°, or 80°, or 81°, or 82°, or 83°, or 84°, or 85°, or 86°, or 87°, or 88°, or 89°, or 90°. In related embodiments, each of the strips of the light redirecting film articles 210, as applied along a respective one of the tabbing ribbon lines 250, are identically formed and are substantially identically oriented (e.g., within 10% of a truly identical relationship) relative to the length direction LD. While the light redirecting film articles 210 are illustrated in FIG. 7B as each extending continuously across the PV module 200, in other embodiments, the light redirecting film article 210 can be a smaller-length strip or segment applied to an individual one of the PV cells 202 for example. Regardless, in some configurations, the primary axis A of all of the reflectorized microstructures 260 of all of the light redirecting film articles 210 (at least as applied over the tabbing ribbon lines 250) are oblique with respect to the length direction LD in some embodiments. In related optional embodiments in which other inactive regions of the PV module are covered by a light redirecting film article of the present disclosure and arranged so as to extend in the width direction WD (or any other direction other than the length direction LD), the so-applied light redirecting film article format (in term of bias angle B) can differ from that of the light redirecting film article 210 as shown. In some embodiments, including embodiments in which the PV module is in the portrait orientation or embodiments in which the bias angle is 45° (plus or minus 5°), the light redirecting film article format can be selected as a function of the particular installation site, for example such that upon final installation, the primary axis of the corresponding reflectorized microstructures are all substantially aligned with the East-West direction of the installation site (e.g., the primary axis deviates no more than 45 degrees from the East-West direction, optionally no more than 20 degrees from the East-West direction, alternatively no more than 5 degrees from the East-West direction, alternatively aligned with, the East-West direction).

Figure 8:
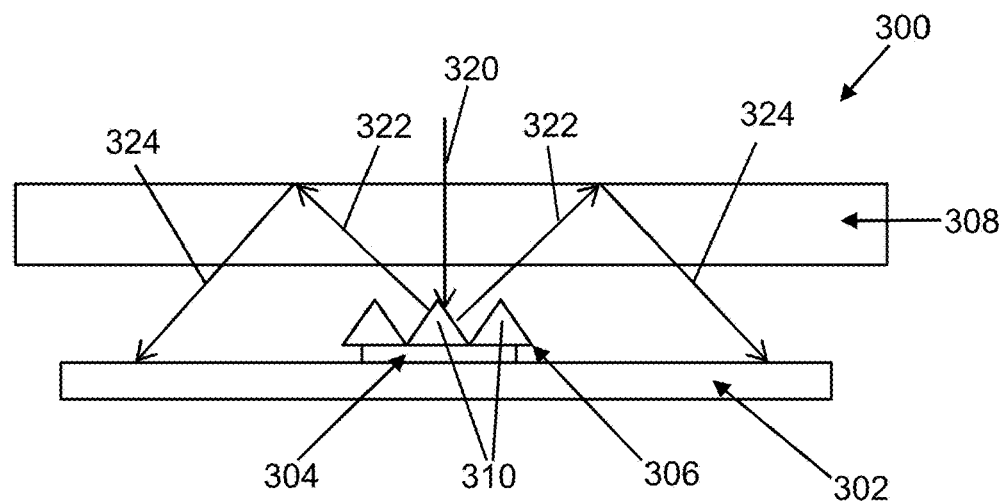
FIG. 8 is a schematic side view of a portion of a conventional PV module.

It has surprisingly been found that PV modules incorporating the light redirecting film articles in accordance with the present disclosure have increased optical efficiency as compared to conventional designs. As a point of reference, FIG. 8 is a simplified representation of a portion of a conventional PV module 300, including a PV cell 302 and an electrical connector 304. A conventional light reflecting film 306 is disposed over the electrical connector 304. A front-side layer 308 (e.g., glass) covers the assembly. The light reflecting film 306 includes reflective microprisms 310 (a size of each of which is greatly exaggerated in FIG. 8). Incident light (identified by arrow 320) impinging on the light reflecting film 306 is discretely reflected (identified by arrows 322) is discretely reflected back at angles of larger than the critical angle of the front-side layer 308. This light undergoes total internal reflection (TIR) to reflect back (identified by arrows 324) back to the PV cell 302 (or other PV cells of the PV module 300) for absorption. Typically, the normal incidence beam 320 can undergo a total deviation of more than 26° in the plane perpendicular to the primary axis of the reflective microprisms 310 before TIR is defeated.

Figure 9:
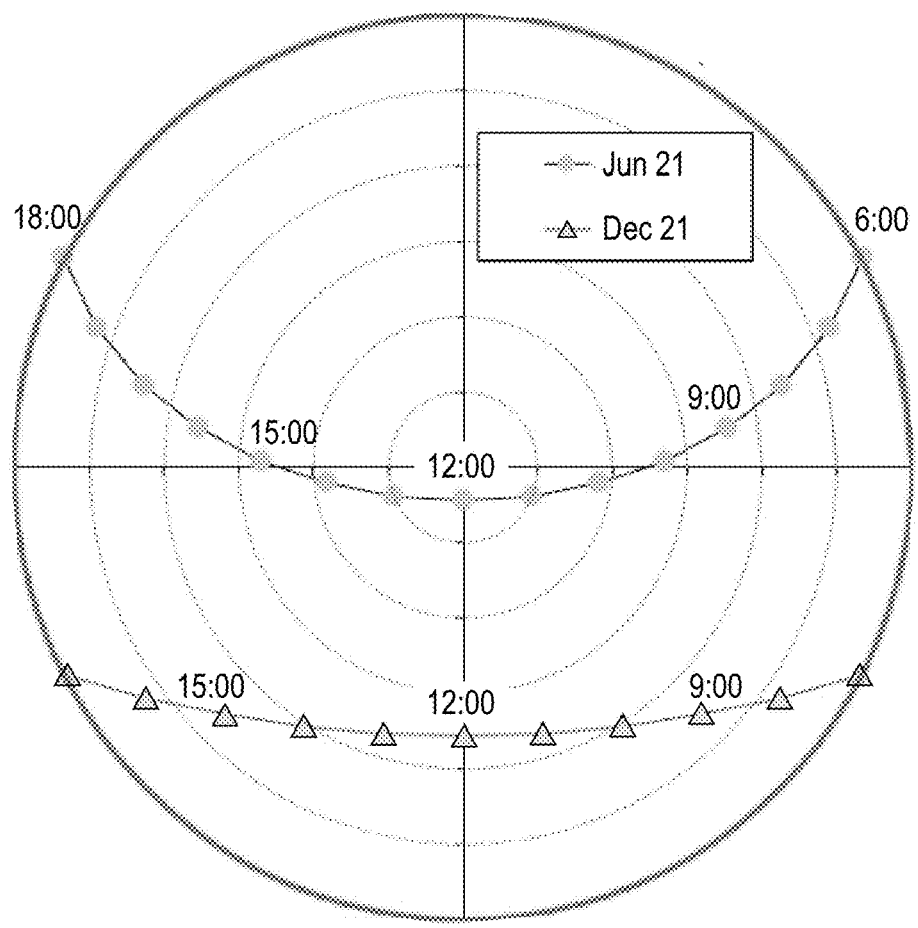
FIG. 9 is a conoscopic representation of the solar path for 30° North latitude.

The reflective microprisms 310 are illustrated in FIG. 8 as being in-line or parallel with the longitudinal axis of the conventional light reflecting film 306 (i.e., the light reflecting film 306 is different from the light redirecting films and articles of the present disclosure, and the corresponding PV module 300 is different from the PV modules of the present disclosure). Under circumstances where the PV module 300 is part of a two-dimensional tracking-type PV module installation, the PV module 300 will track movement of the sun, such that over the course of the day, incident light will have the approximate relationship relative to the reflective microprisms 310 as shown, desirably experiencing reflection at angles larger than the critical angle. Under circumstances where the PV module 300 is part of a one-dimensional tracking-type PV module installation, the PV module 300 will track movement of the sun, but incident light is not guaranteed to have the approximate relationship relative to the reflective microprisms 310 as shown over the course of the day, and may not generate reflection angles that correspond to TIR at all times. Further, where the particular installation is stationary or non-tracking, as the angle of sun changes with respect to the facet angle(s) of the reflective microprisms 310, some of the light will be reflected at angles outside of the critical angle and escape back through the front-side layer 308. Non-tracking systems inherently have some degree of asymmetry as the sun's position relative to the PV module changes throughout the day and year. The angle of incidence of the sun with respect to the face of the PV module will change by up to 180° (East to West) over the course of the day, and by up to 47° (North to South) over the year. FIG. 9 is a conoscopic representation plot of the path of the sun for a 30° North latitude location. The center of the plot is the Zenith. East is represented at the 3 o'clock position and North is represented at the 12 o'clock position. On the Summer Solstice, the sun traces the arc closest to the center of the plot. On the Winter Solstice, the sun traces the arc furthest from the center of the plot. Dark regions within the central white region are display errors due to sampling frequency.

Returning to FIG. 8, due to changes in the sun's position over the course of the day and year (relative to a non-tracking or stationary PV module installation), the angular response of the reflective microprisms 310 is not uniform at all angles of incidence. This angular response coupled with the solar path effectively dictates that the conventional PV module 300, and in particular the conventional light reflecting film 306 as incorporated therein, is orientation dependent. More particularly, with conventional constructions in which the reflective microprisms 310 are parallel or aligned with the length direction LD (not identified in FIG. 8, but will be understood to be into a plane of the page of FIG. 8) of the PV module 300, the light reflecting film 306 will increase the energy output for the PV module 300 to a certain extent, though at a less-than optimal level as the sun's position changes over the course of the day and year. A spatial orientation of the length direction LD relative to the sun will also impact the optical efficiency of the PV module 300/light reflecting film 306. Typically, and as shown by a comparison of FIGS. 10A and 10B, non-tracking PV modules are installed in either a landscape orientation (FIG. 10A) or a portrait orientation (FIG. 10B). In the landscape orientation, the reflective prisms 310 (FIG. 8) are aligned with the East-West direction; in the portrait orientation, the reflective prisms 310 are aligned with North-South direction. Thus, when the bias angle is zero, the angular response of the reflective prisms 310 coupled with the solar path results in the landscape orientation of the PV module 300 having an increased energy output as compared to the same PV module 300 in the portrait orientation as described below.

The discussion that follows in this paragraph assumes that the bias angle for the light redirecting film article is zero when installed on the PV modules either in landscape or portrait. In the landscape orientation (FIG. 10A), light reflecting from the reflective prisms 310 (FIG. 8) is directed almost exclusively within angles trapped by TIR at the interface of external air and the front-side layer 308 (FIG. 8). In portrait orientation (FIG. 10B), light reflecting from the reflective prisms 310 is directed into angles trapped by TIR only between certain hours of day light (e.g., mid-day such as between 10:00 AM and 2:00 PM). During the remainder of the day, light is only partially reflected at the interface of external air and the front-side layer 308 onto the PV module. For example, FIG. 11A depicts the angles for which the reflective prisms 310 (FIG. 104) effectively trap the reflected light for the PV module 300 (FIG. 10A) under installation conditions of non-tracking, South-facing, landscape oriented, with the module tilted 10° from the ground for a 30° North latitude location and superimposed on the solar path conoscopic plot of FIG. 9. FIG. 11B represents information for the same PV module installation conditions, except that the PV module 300 is in a portrait orientation (i.e., the orientation of FIG. 10B). The efficiency of the light reflecting film 306 (FIG. 8) is shown in the panels of FIGS. 11 to 14 in greyscale, with light areas being the most efficient at trapping incident light by TIR and reflecting light onto the PV module, and dark areas being least efficient. As can be seen from the plots, the landscape orientation (FIG. 11A) is very efficient with the exception of midday during the winter when the reflected light is not trapped within the module by TIR, as shown by the light grey region near the bottom of the plot. The portrait orientation (FIG. 11B) is only efficient midday throughout the year as shown by the brighter area near the center of the plot (sunrise is represented on the right-hand side of the plot, noon at the center, and sunset on the left-hand side of the plot).

The present disclosure overcomes the orientation dependent drawbacks of previous PV modules designs. In particular, by incorporating the light redirecting film articles of the present disclosure into the PV module construction, optical efficiency of the resultant PV module is similarly increased regardless of portrait or landscape orientation. For example, and returning to the non-limiting embodiment of FIG. 7B, the light redirecting film articles 210 otherwise covering the tabbing ribbons 204 (FIG. 7A), can be constructed and arranged relative to the length direction LD of the PV module 200 such that the primary axis A of each of the reflectorized microstructures 260 is biased 45° relative to the longitudinal axis X (i.e., the bias angle B as described above is 45°) and thus relative to the length direction LD. FIG. 12A is a modeling of the so-constructed PV module 200 (i.e., comprising a light redirecting film article with a bias angle of 45°) installed under the same conditions as FIG. 11A (i.e., landscape orientation, South-facing, with the module tilted 10° from the ground at a 30° North latitude location) superimposed over the solar path conoscopic plot of FIG. 9. FIG. 12B is a modeling of a PV module 200 comprising a light redirecting film article with a bias angle of 45° installed under the same conditions as FIG. 11B (i.e., portrait orientation, South-facing, with the module tilted 10° from the ground at a 30° North latitude location) superimposed over the solar path conoscopic plot of FIG. 9. Again, light areas represent high efficiency; dark areas are less efficient.

A comparison of FIGS. 12A and 12B reveals that the annual efficiency of the PV module 200, comprising a light redirecting film article with a bias angle of 45°, is very similar in both landscape and portrait orientations (compare the area of the white portions of the plots). It should be noted that both orientations have lower efficiency seasonally. While landscape orientation has lower efficiency in the afternoon during the summer, the lower efficiency manifests itself during morning for portrait orientation. Similarly in the fall, winter and spring, the lower efficiency for landscape orientation is in the morning but in the afternoon for portrait orientation. Further, a comparison of FIGS. 12A and 12B with FIGS. 11A and 11B reveals that the annual efficiency of the PV module 200 (with 45° biased reflectorized microstructures) is consistent with the average of the conventional PV module (with "aligned" or on-axis reflective microprisms) in landscape and portrait orientations. Nonetheless, when orientation of the PV module is dictated by the topography of the installation site and either cannot be freely selected (e.g. the roof of a residential site) or is out of the control of PV module purchaser, the use of light redirecting film article with a bias angle of 45° offers advantages over a light redirecting film article with a bias angle of 0°, which only performs most efficiently when installed in a landscape orientation.

Another embodiment of a light redirecting film of the present disclosure performs most efficiently in a portrait orientated module. The landscape orientated module having such light redirecting film is then disadvantaged. In particular, by incorporating the light redirecting film articles of the present disclosure into the PV module construction, the orientation dependence of the optical efficiency of the resultant PV module is transposed. For example, and returning to the non-limiting embodiment of FIG. 7B for illustration purposes, the light redirecting film articles 210 otherwise covering the tabbing ribbons 204 (FIG. 7A), can be constructed and arranged relative to the length direction LD of the PV module 200 such that the primary axis A of each of the reflectorized microstructures 260 is biased −82° relative to the longitudinal axis X (i.e., the bias angle B as described above is −82° and thus relative to the length direction LD. FIG. 13A is a modeling of the so-constructed PV module 200 installed under the same conditions as FIG. 11A (i.e., landscape orientation, South-facing, with the module tilted 10° from the ground at a 30° North latitude location) superimposed over the solar path conoscopic plot of FIG. 9. FIG. 13B is a modeling of the so-constructed PV module 200 (having light redirecting film article with a bias angle of −82°) installed under the same conditions as FIG. 11B (i.e., portrait orientation, South-facing, with the module tilted 10° from the ground at a 30° North latitude location) superimposed over the solar path conoscopic plot of FIG. 9. Again, light (whiter) areas represent high efficiency; dark areas are least efficient.

A comparison of FIGS. 11A and 13B reveals that the annual efficiency of the PV module 200 is very similar (compare the area of the white portions of the plot). A comparison of FIGS. 11B and 13A reveals that the annual efficiency of the PV module 200 is very similar.

Table 1 shows the results of various bias angle reflective microprisms from ray trace modeling for a 10° module tilt at 30° North latitude (similar in latitude to a module located in Shanghai, China or Austin, Tex.). The solar angles were calculated in 10 minute intervals over the course of one year for use as input to the ray tracing algorithm. The amount of light absorbed by the PV cell was calculated for each solar angle. The total light absorbed was obtained by weighting each solar angle result by the solar irradiance as calculated by Hottel's clear sky model. Table 1 contains the percent improvement for PV modules with light redirecting film articles as compared to PV modules without light redirecting film articles.

TABLE 1

Tabular results of bias angle versus percent annual improvement for 30° latitude and 10° tilt for PV modules in landscape and portrait orientation.

| Bias Angle | Landscape Oriented | Portrait Oriented |
| --- | --- | --- |
| 0 | 1.76% | 1.25% |
| 5 | 1.76% | 1.25% |
| 10 | 1.75% | 1.27% |
| 15 | 1.75% | 1.29% |
| 20 | 1.74% | 1.31% |
| 25 | 1.73% | 1.34% |
| 30 | 1.70% | 1.39% |
| 35 | 1.66% | 1.47% |
| 40 | 1.61% | 1.50% |
| 45 | 1.56% | 1.51% |
| 50 | 1.49% | 1.52% |
| 55 | 1.38% | 1.53% |
| 60 | 1.27% | 1.54% |
| 65 | 1.23% | 1.58% |
| 70 | 1.22% | 1.60% |
| 75 | 1.19% | 1.61% |
| 80 | 1.16% | 1.62% |
| 82 | 1.13% | 1.62% |
| 85 | 1.04% | 1.62% |
| 90 | 0.92% | 1.62% |

The models of FIGS. 13A and 13B represent performance of one non-limiting example of a light redirecting film article (i.e., with a bias angle B of −82°) of the present disclosure in combination with a PV module. In other embodiment PV modules in accordance with principles of the present disclosure, the obliquely arranged reflectorized microstructures of the provided light redirecting film article(s) (e.g., covering at least portions of one or more of the tabbing ribbons) can have a bias angle other than −82° and improved efficiencies achieved. In addition or alternatively, the facet(s) of the microstructures (and thus of the resultant reflectorized microstructures) can exhibit non-uniformities that modify the reflected irradiance. For example, and as described above, in some embodiments the light redirecting film useful with the light redirecting film articles of the present disclosure can be manufactured using a microreplication tool that is generated by a fly-wheel (or similar) cutting process that inherently imparts variations into the tool, and thus into the reflectorized microstructure facet(s). When employed as part of a PV module (e.g., covering at least a portion of a tabbing ribbon), light impinging on the facet variations experiences diffusion that in turns spreads the reflected beam of what would otherwise be a specular reflection (i.e., were the variations not present). As a point of reference, if the specularly reflected beam would be at an angle outside of the critical angle for TIR, it may escape the PV module into a narrow angular range and may cause stray light or glare. It is expected that even modest diffusion of the reflected light by plus or minus 1° spreads the reflection in such a way as to decrease the radiance of this stray light by a factor of 25.

Returning to FIG. 7B for illustration purposes, the light redirecting film articles 210 can be formatted to provide a common bias angle B that is "tuned" to the particular installation conditions of the PV module 200, optionally balancing orientation and seasonality. For example, in some embodiments of the present disclosure, the PV module manufacturer can have different versions of the light redirecting film articles of the present disclosure available, each version providing a different reflectorized microstructure bias angle. The PV module manufacturer then evaluates the conditions of a particular installation site and selects the light redirecting film article having a reflectorized microstructure bias angle best suited for those conditions. In related embodiments, a manufacturer of the light redirecting film articles of the present disclosure can be informed by the PV module manufacturer of the conditions of a particular installation and then generate a light redirecting film article having a bias angle best suited for those conditions.

In addition to optionally rendering the PV module 200 to be orientation independent (in terms of optical efficiency of the light redirecting film articles 210 having a bias angle of 45° as applied over the tabbing ribbons 204 (FIG. 7A)) or providing maximum efficiency with light redirecting film articles 210 having a bias angle of, for example, 82°, the light redirecting film articles and corresponding PV modules of the present disclosure can offer other advantages over PV modules conventionally incorporating a light reflecting film with reflective microprisms arranged in the on-axis direction. For example, with a conventional PV module having on-axis reflective microprisms and arranged in the portrait orientation (e.g., the PV module 300 of FIG. 10B), glare is oftentimes evident during the times light reflected by the light reflecting film 306 does not undergo TIR at the interface between external air and the front-side layer 208 (FIG. 8). The angle of the reflected light causing glare changes as the sun moves. With the light redirecting film articles and corresponding PV modules of the present disclosure, the time of day and seasonality of the glare, if any, can be shifted as desired (as a function of the bias angle selected for the light redirecting film articles incorporated into the PV module). For example, the light redirecting film article, as applied over the tabbing ribbons, can be formatted such that glare into a building proximate the PV module installation during the afternoon is avoided.

Figure 14A:
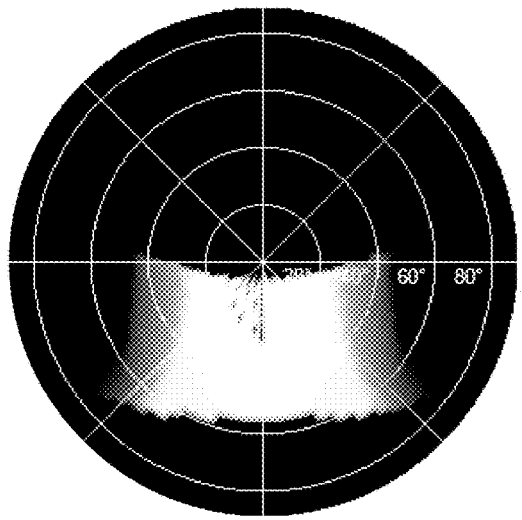
FIG. 14A is a plot of modeled efficiency of the conventional PV module of FIG. 8 in portrait orientation at a 30° North latitude location, 10° from the ground, and facing due-South superimposed on the conoscopic plot of FIG. 9.
Figure 14B:
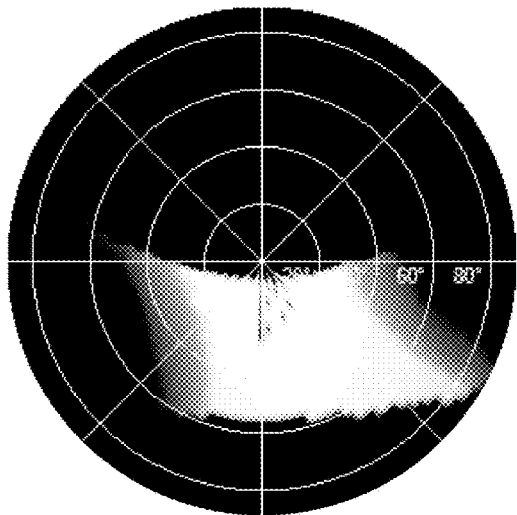
FIG. 14B is a plot of modeled efficiency of the conventional PV module of FIG. 8 in portrait orientation at a 30° North latitude location, 10° from the ground, and facing 20° East of due-South superimposed on the conoscopic plot of FIG. 9.
Figure 14C:
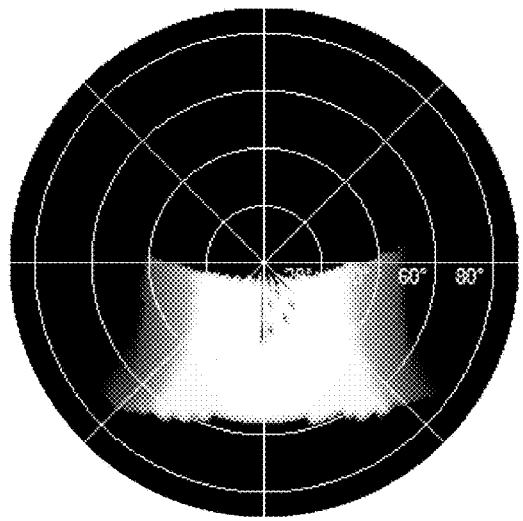
FIG. 14C is a plot of modeled efficiency of the PV module of FIG. 6A in portrait orientation at a 30° North latitude location, 10° from the ground, and facing 20° East of due-South superimposed on the conoscopic plot of FIG. 9.

Additionally, it is sometimes the case that installation site restrictions do not allow the PV module to face due south (in Northern Hemisphere locations) as would otherwise be desired. The performance of a non-South facing (Northern Hemisphere), conventional PV modules (otherwise incorporating a light reflecting film with on-axis reflective microprisms) is undesirably skewed. The light redirecting film articles and corresponding PV modules of the present disclosure can be formatted to overcome these concerns, incorporating a biased reflectorized microstructure orientation that corrects for the expected skew. For example, FIG. 14A illustrates the performance results for a conventional PV module (incorporating a conventional light reflecting film with on-axis reflective microprisms) installed to be south-facing, portrait oriented, and with the module tilted 10° from the ground at a 30° North latitude location with morning-afternoon symmetry superimposed over the solar path conoscopic plot of FIG. 9. FIG. 14B illustrates the performance results for a PV module under the same installation conditions except rotated 20° towards the East. The morning-afternoon symmetry is broken with higher efficiency in the morning and lower efficiency in the afternoon. Finally, FIG. 14C models the performance for a PV module in accordance with the present disclosure and incorporating light redirecting film article with reflectorized microstructures each having a primary axis biased 20°, and arranged under the same conditions as FIG. 14B (i.e., portrait orientation, with the module tilted 10° from the ground, rotated 20° East from due South). The biased reflectorized microstructures center the performance of the non-South facing PV module to be more closely akin to that of a South facing PV module.

While some of the present disclosure has exemplified the use of light redirecting film articles on tabbing ribbons, as mentioned before, the light redirecting film articles having non-zero biased angles of the present disclosure can also be used on areas of the PV module that have no PV cells, such as, for example, in between PV cells and around the perimeter of the cells.

Figure 15:
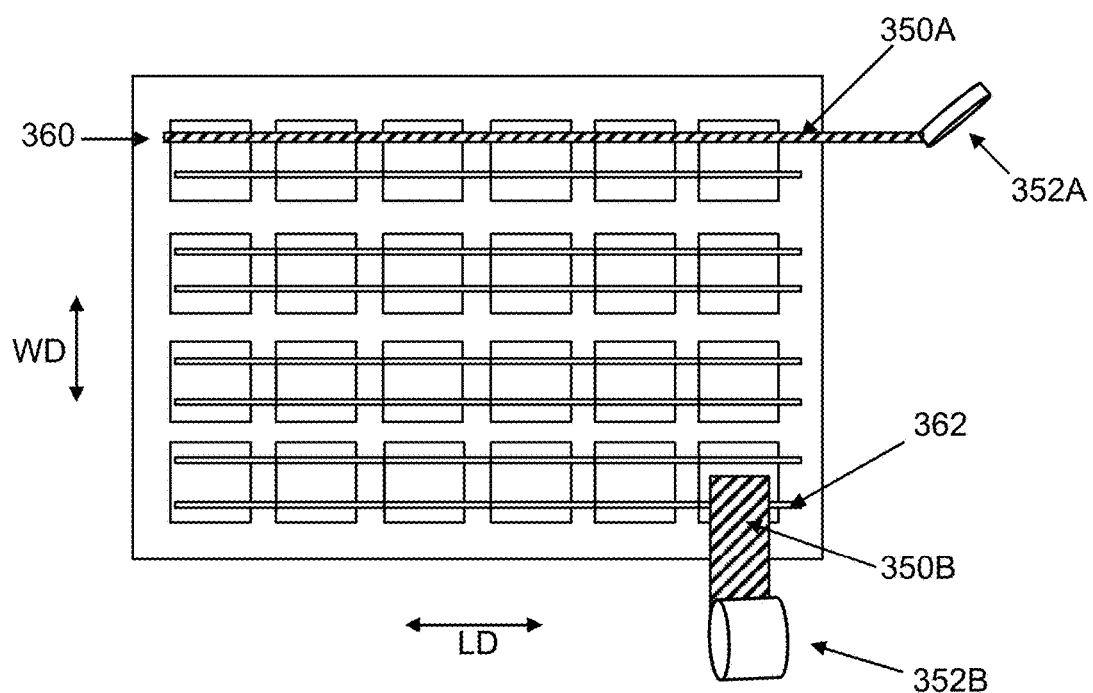
FIG. 15 is a simplified top plan view illustrating manufacture of a PV module in accordance with principles of the present disclosure.

Further optional benefits associated with some embodiments of the present disclosure relate to flexibility in the manufacture of a PV module. With reference to FIG. 15, PV manufactures may sometimes desire to apply strips of the light redirecting film article in the length direction LD (e.g., applied over one of the tabbing ribbons in the same direction as the tabbing ribbon). This approach is reflected in FIG. 15 by a strip of a light redirecting film article 350A being applied, from a first roll 352A, in the length direction LD along a first tabbing ribbon line 360. In other instances, it is desired to apply the light redirecting film article in the width direction WD (e.g., perpendicular to a length of one of the tabbing ribbons and cut to a width of the tabbing ribbon in situ). For example, FIG. 15 shows a strip of a light redirecting film article 350B being applied, from a second roll 352B, to a second tabbing ribbon 362. With non-limiting embodiments which the PV module manufacturer is provided with a light redirecting film article in accordance with principles of the present disclosure and having a reflectorized microstructure bias angle B of 45°, the PV module manufacturer is afforded the flexibility of applying the light redirecting film article in either direction yet still achieve the benefits described above. For example, the same roll 352A or 352B can be used to apply the corresponding light redirecting film article 350A or 350B in either the length direction LD or the width direction WD. Any bias angle may be manufactured to allow application from a roll 350A or 350B. The condition on the bias angle is such that the bias angle of roll 350A and the bias angle of roll 350B are complementary.

The light redirecting film articles of the present disclosure provide a marked improvement over previous designs. The biased angle, reflective surface microstructures of the light redirecting film articles present unique optical properties not available with conventional on-axis light redirecting films. The light redirecting film articles of the present disclosure have numerous end use applications, such as, for example, with PV modules. The PV modules of the present disclosure can have improved efficiencies independent of orientation. Moreover, other improvements to PV module performance can be achieved with the light redirecting film articles of the present disclosure.

Although the present disclosure has been described with reference to preferred embodiments, workers skilled in the art will recognize that changes can be made in form and detail without departing from the spirit and scope of the present disclosure. For example, while the light redirecting film articles of the present disclosure have been described as being useful with PV modules, multiple other end-use applications are equally acceptable. The present disclosure is in no way limited to PV modules.

EXAMPLES

The present invention is more particularly described in the following examples that are intended as illustrations only, since numerous modifications and variations within the scope of the present invention will be apparent to those skilled in the art.

Example 1

A master tool was generated by a fly-cutting system and method as described in U.S. Pat. No. 8,443,704 (Burke et al.) and U.S. Application Publication No. 2009/0038450 (Campbell et al.). Using this method, grooves with a bias angle of 45° and apex angle of 120° were cut into a master tool.

A microstructured film was fabricated using the master tool as described in U.S. Pat. No. 6,758,992 (Solomon, et al.) by curing a polymerizable resin (e.g., a UV-curable acrylate resin) that was applied to a 75 micron thick polyethylene terephthalate (PET) polymer film and shaped by the master tool. Ultraviolet radiation was used to cure the resin in the shape provided by the structure of the master tool while the master tool contacted the polymer film. The bias angle of the master tool design used to make these prisms caused the prisms to have a bias angle of 45° with respect to the web axis of the PET film.

A reflective coating was applied to the microprisms in a manner similar to that described in U.S. Pat. No. 4,307,150 (Roche et al.). An opaque specular metallic surface was vapor coated onto the microprisms using high purity (99.88+%) aluminum to a thickness of approximately 80 nm.

Example 2

A master tool was generated using the fly-cutting system and method described in Example 1. Grooves with a bias angle of −82° and apex angle of 120° were cut into a master tool.

A microreplicated film was fabricated as described in Example 1. This microreplicated film had prisms at a bias angle of −82° with respect to the web direction of the film.

A reflective coating was applied to the microprisms as described in Example 1. An opaque specular metallic surface was vapor coated onto the microprisms using high purity (99.88+%) aluminum to a thickness of approximately 80 nm.

RESULTS

Light redirecting film articles were analyzed using an Eldim EZContrast L80 instrument (Eldim S. A., Hérouville-Saint-Clair, France) with collimated beam reflective option. This instrument illuminates a sample using a narrow angle source while collecting the reflected light for analysis of its angular distribution. Samples of 3M Solar Light Redirecting Film (LRF) T80 (3M Company, St. Paul, Minn.), Example 1, and Example 2 were adhered to a glass plate. The LRF T80 sample served as a Comparative Example. The "downweb" axes of the films were carefully aligned by using fiducial markings and an alignment guide. Normal axis was obtained by analyzing the reflection from the glass slide and adjusting the collimated beam reflective attachment. Each film was positioned such that the "downweb" axis was along the same direction. Conoscopic images were captured for each film.

Ray trace models of these films were also created for conoscopic analysis. Using a 3M proprietary ray tracing code, surfaces and materials of a PV module were assembled to create an optical model as depicted in FIG. 8. The analysis can be performed, however, using commercially available software, such as TracePro from Lambda Research Corporation, Littleton, Mass. The PV module included 4 mm low iron glass having a refractive index of 1.51 and extinction coefficient of 0.0025, 2 mm encapsulant of refractive index 1.482 and extinction coefficient 0.0025, 0.1 mm 120° apex angle light redirecting film with specular reflectance of 86.8%, 0.1 mm tabbing ribbon with diffuse reflectance of 20% and 0.18 mm silicon with 98% absorption and 2% specular reflectance. The reflectance of the tabbing ribbon was adjusted such that a 10% quantum efficiency was achieved to be consistent with light-beam-induced current measurements. The light redirecting film article was 1.5 mm wide and placed on a 1.5 mm wide tabbing ribbon. For a given latitude the solar position and angles were calculated every 10 minutes of the year. Rays coincident with the solar position and angle impinged on the PV module of certain orientation and module tilt. Each element of the PV module may transmit, reflect and absorb a portion of each ray based on material properties until the ray intensity decreases to 0.001% of the input ray with the element absorption monitored. The total annual absorption was weighted based on solar irradiance and incident angle as predicted by Hottel's Clear Sky Model for PV module containing the light redirecting film article and a PV module without the light redirecting film article. The annual percent improvement of the light redirecting film article was obtained by dividing the total weighted absorption of the light redirecting film article PV module by the total weighted absorption of the PV module absent the light redirecting film module and subtracting 1. Normal angle light illuminated each film. The angles of reflected light were captured for display.

FIG. 16 shows the ray trace diagram compared to the measured light redirection results obtained using the L80 instrument for the Comparative Example comprising LRF T80. The ray tracing diagram is shown as FIG. 16A and the measured light redirection results as FIG. 16B. Light is directed along the horizontal axis into inclination angles of +60° and −60°. Because the light is redirected into +/−60°, the reflected light will be trapped by TIR. In FIG. 16B the light at the center of the plot results from internal reflections in the Eldim EZContrast L80 collimated beam reflection option lens system. An analysis of FIGS. 16A and 16B demonstrates the validity of the ray tracing model with LRF having a bias angle B of zero degrees given that the actual measurements using the Eldim L80 show similar reflection of the light +/−60° with respect to the perpendicular to the film plane and orthogonal to the primary axis as the results from the modeling.

FIG. 17 shows the ray trace diagram compared to the measured light redirection results obtained using the L80 instrument for Example 1, with the ray tracing diagram shown as FIG. 17A and the measured light redirection results as FIG. 17B. Light is directed along an axis 45° from the horizontal axis into inclination angles of +60° and −60°. In FIG. 17B the light at the center of the plot results from internal reflections in the Eldim EZContrast L80 collimated beam reflection option lens system. As with the data in FIG. 16, the results in FIG. 17 also validate the model because the measured results in FIG. 17A are consistent with the modeling results in FIG. 17B for LRF having a bias angle of 45 degrees.

Figure 18A:
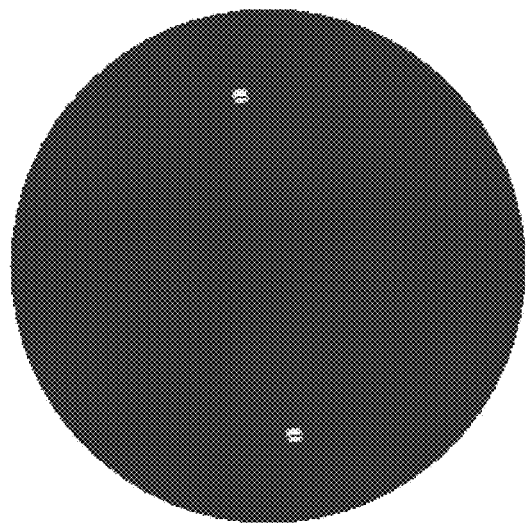
FIG. 18A is a ray trace diagram showing the calculated light redirecting properties of Example 2.
Figure 18B:
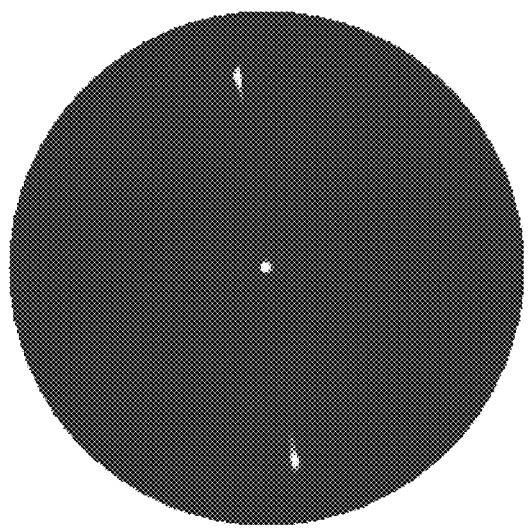
FIG. 18B is a diagram showing the measured light redirection properties of Example 2.

FIG. 18 shows the ray trace diagram compared to the measured light redirection results obtained using the L80 instrument for Example 2, with the ray tracing diagram shown as FIG. 18A and the measured light redirection results as FIG. 18B. Light is directed along the an axis −82° (98°) from the horizontal axis into inclination angles of +60° and −60°. In FIG. 18B the light at the center of the plot results from internal reflections in the Eldim EZContrast L80 collimated beam reflection option lens system. These results also show good agreement between the measured results and the modeling results for LRF having a bias angle of 82 degrees.

Example 3

Tracking Systems Modeling

Figure 19A:
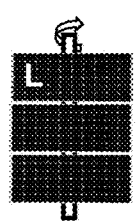
FIG. 19A is a schematic diagram of one-axis solar tracking systems with North-South orientation and having photovoltaic panels arranged in landscape orientation.
Figure 19B:
FIG. 19B is a schematic diagram of one-axis solar tracking systems with North-South orientation and having photovoltaic panels arranged in portrait orientation.

Under circumstances where the PV module 300 is part of a one-dimensional tracking-type PV module installation, the PV module 300 will track movement of the sun. The axis of the tracking system is typically aligned in the North-South direction with rotation occurring from East in the morning to West in the afternoon, as shown in FIG. 19. Panels are typically arranged on these trackers with landscape orientation (such that when parallel to the ground, the long dimension of the PV module aligns East-West, labeled with an "L" in FIG. 19A). This orientation allows larger collection area than panels arranged in the orthogonal (portrait) orientation (labeled with a "P" in FIG. 19B). The results of ray trace modeling for various bias angles presented in Table 2 show that the 50° bias light redirecting film article provides the highest annual energy improvement for 30° North latitude. The inventors have discovered that for tracking systems with panels aligned in the North-South direction having East-West tracking, the bias angle for the highest energy improvement is dependent on the latitude, as shown in Table 3. Thus, in certain embodiments, at a latitude of 0 degrees, the light redirecting film article has a bias angle from 0 to 65 degrees when installed on PV modules with landscape panels aligned in the North-South direction and having East-West tracking (e.g., such as those in FIG. 19A). As shown in Table 3, under those conditions, a bias angle of 65 degrees provides the highest energy improvement. In other embodiments, for a latitude of 15 degrees, for East-West tracking landscape PV panels, the light redirecting film article has a bias angle from 30 to 75 degrees, with the highest energy improvement with a bias angle of 55 degrees. In other embodiments, for a latitude of 30 degrees, for East-West tracking landscape PV panels, the light redirecting film article has a bias angle from 40 to 80 degrees, with the highest energy improvement with a bias angle of 50 degrees. In other embodiments, for a latitude of 45 degrees, for East-West tracking landscape PV panels, the light redirecting film article has a bias angle from 45 to 90 degrees, with the highest energy improvement with a bias angle of 50 degrees. In other embodiments, for a latitude of 60 degrees, for East-West tracking landscape PV panels, the light redirecting film article has a bias angle from 45 to 90 degrees, with the highest energy improvement with a bias angle of 90 degrees. In other embodiments, for a latitude of 75 degrees, for East-West tracking landscape PV panels, the light redirecting film article has a bias angle from 50 to 90 degrees, with the highest energy improvement with a bias angle of 90 degrees.

Figure 20A:
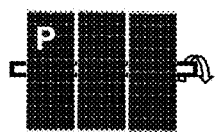
FIG. 20A is a schematic diagram of one-axis solar tracking systems with East-West orientation and having photovoltaic panels arranged in portrait orientation.
Figure 20B:
FIG. 20B is a schematic diagram of one-axis solar tracking systems with East-West orientation and having photovoltaic panels arranged in landscape orientation.

Occasionally, the axis of the tracking system is aligned in the East-West direction with rotation occurring from South in the morning toward the North as the sun elevation angle increases until solar noon, then back toward the South in the afternoon, as shown in FIG. 20. Panels are typically arranged on these trackers with portrait orientation (such that when parallel to the ground, the long dimension of the PV module aligns North-South, as shown in FIG. 20A). This orientation allows larger collection area than panels arranged in the orthogonal (landscape) orientation (as shown in FIG. 20B). The results of ray trace modeling for various bias angles presented in Table 2 show that the annual energy improvement of the light redirecting film article is nearly constant at the maximum for angles greater than approximately 70° for 30° North latitude The inventors have discovered that for tracking systems with portrait panels aligned in the East-West direction, having a North-South tracking (such as those in FIG. 20A), the bias angle for the highest energy improvement is 90°, virtually independent of latitude, as shown in Table 4. Thus, in certain embodiments, at a latitude of 0 degrees, the light redirecting film article has a bias angle from 45 to 90 degrees when installed on PV modules with portrait panels aligned in the East-West direction and having North-South tracking (e.g., such as those in FIG. 20A). As mentioned above and as shown in Table 4, under those conditions, a bias angle of 90 degrees provides the highest energy improvement. In other embodiments, for a latitude of 15 degrees, for North-South tracking portrait PV panels, the light redirecting film article has a bias angle from 45 to 90 degrees, with the highest energy improvement with a bias angle of 90 degrees. In other embodiments, for a latitude of 30 degrees, for North-South tracking portrait PV panels, the light redirecting film article has a bias angle from 45 to 90 degrees, with the highest energy improvement with a bias angle of 90 degrees. In other embodiments, for a latitude of 45 degrees, for North-South tracking portrait PV panels, the light redirecting film article has a bias angle from 45 to 90 degrees, with the highest energy improvement with a bias angle of 90 degrees. In other embodiments, for a latitude of 60 degrees, for North-South tracking portrait PV panels, the light redirecting film article has a bias angle from 50 to 90 degrees, with the highest energy improvement with a bias angle of 90 degrees. In other embodiments, for a latitude of 75 degrees, for North-South tracking portrait PV panels, the light redirecting film article has a bias angle from 50 to 90 degrees, with the highest energy improvement with a bias angle of 90 degrees.

TABLE 2

Results of ray trace modeling for one-dimensional tracking systems located at 30° North latitude shown as a percent increase compared to PV modules without light directing film articles

| Bias Angle | E-W Tracker (N-S Axis) Landscape Oriented | N-S Tracker (E-W Axis) Portrait Oriented |
| --- | --- | --- |
| 0 | 1.54% | 1.15% |
| 5 | 1.54% | 1.15% |
| 10 | 1.56% | 1.18% |
| 15 | 1.58% | 1.21% |
| 20 | 1.62% | 1.25% |
| 25 | 1.67% | 1.31% |
| 30 | 1.74% | 1.40% |
| 35 | 1.83% | 1.50% |
| 40 | 1.94% | 1.65% |
| 45 | 2.09% | 1.83% |
| 50 | 2.11% | 1.95% |
| 55 | 2.02% | 1.94% |
| 60 | 1.98% | 1.94% |
| 65 | 1.99% | 1.95% |
| 70 | 2.00% | 1.96% |
| 75 | 1.98% | 1.97% |
| 80 | 1.93% | 1.99% |
| 82 | 1.89% | 1.99% |
| 85 | 1.85% | 2.00% |
| 90 | 1.88% | 2.01% |

TABLE 3

Results of ray trace modeling for one-dimensional tracking systems with varying latitude for landscape and portrait PV panels having an East-West tracking system.

| Latitude | bias angle for peak in landscape orientation | bias angle for peak in portrait orientation |
| --- | --- | --- |
| 0 | 65 | 0 |
| 15 | 55 | 0 |
| 30 | 50 | 0 |
| 45 | 50 | 0 |
| 60 | 90 | 0 |
| 75 | 90 | 0 |

TABLE 4

Results of ray trace modeling for one-dimensional tracking systems with varying latitude for landscape and portrait PV panels having an North-South tracking system.

| Latitude | bias angle for peak in landscape orientation | bias angle for peak in portrait orientation |
| --- | --- | --- |
| 0 | 0 | 90 |
| 15 | 0 | 90 |
| 30 | 0 | 90 |
| 45 | 0 | 90 |
| 60 | 0 | 90 |
| 75 | 0 | 90 |

EXEMPLARY EMBODIMENTS

Embodiment 1

A light redirecting film article comprising:
a light redirecting film defining a longitudinal axis and including:
a base layer;
an ordered arrangement of a plurality of microstructures projecting from the base layer;
wherein each of the microstructures extends along the base layer to define a corresponding primary axis;
and further wherein the primary axis of at least one of the microstructures is oblique with respect to the longitudinal axis; and
a reflective layer over the microstructures opposite the base layer.

Embodiment 2

The light redirecting film article of embodiment 1, wherein the primary axis of a majority of the microstructures is oblique with respect to the longitudinal axis.

Embodiment 3

The light redirecting film article of any of the preceding embodiments, wherein the primary axis of all of the microstructures is oblique with respect to the longitudinal axis.

Embodiment 4a

The light redirecting film article of any of the preceding embodiments, wherein the longitudinal axis and the primary axis of the at least one microstructure form a bias angle in the range of 1°-90°.

Embodiment 4b

The light redirecting film article of any of the preceding embodiments, wherein the longitudinal axis and the primary axis of all of the microstructures form a bias angle in the range of 1°-90°.

Embodiment 4c

The light redirecting film article of any of the preceding embodiments, wherein the longitudinal axis and the primary axis of the at least one microstructure form a bias angle in the range of −1°--90°.

Embodiment 4d

The light redirecting film article of any of the preceding embodiments, wherein the longitudinal axis and the primary axis of all of the microstructures form a bias angle in the range of 1°--90°.

Embodiment 5a

The light redirecting film article of any of the preceding embodiments, wherein the longitudinal axis and the primary axis of the at least one microstructure form a bias angle in the range of 1°-89°.

Embodiment 5b

The light redirecting film article of any of the preceding embodiments, wherein the longitudinal axis and the primary axis of all of the microstructures form a bias angle in the range of 1°-89°.

Embodiment 5c

The light redirecting film article of any of the preceding embodiments, wherein the longitudinal axis and the primary axis of the at least one microstructure form a bias angle in the range of −1°--89°.

Embodiment 5d

The light redirecting film article of any of the preceding embodiments, wherein the longitudinal axis and the primary axis of all of the microstructures form a bias angle in the range of −1°--89°.

Embodiment 6a

The light redirecting film article of any of the preceding embodiments, wherein the longitudinal axis and the primary axis of the at least one microstructure form a bias angle is in the range of 20°-70°.

Embodiment 6b

The light redirecting film article of any of the preceding embodiments, wherein primary axis of each of the microstructures and the longitudinal axis form a bias angle in the range of 20°-70°.

Embodiment 7a

The light redirecting film article of any of the preceding embodiments, wherein the longitudinal axis and the primary axis of the at least one microstructure form a bias angle is in the range of −20°-7-0°.

Embodiment 7b

The light redirecting film article of any of the preceding embodiments, wherein primary axis of each of the microstructures and the longitudinal axis form a bias angle in the range of −20°--70°.

Embodiment 8a

The light redirecting film article of any of the preceding embodiments, wherein the longitudinal axis and the primary axis of the at least one microstructure form a bias angle is about 45°.

Embodiment 8b

The light redirecting film article of any of the preceding embodiments, wherein the longitudinal axis and the primary axis of all of the microstructures form a bias angle is about 45°.

Embodiment 8c

The light redirecting film article of any of the preceding embodiments, wherein the longitudinal axis and the primary axis of the at least one microstructure form a bias angle is about −45°.

Embodiment 8d

The light redirecting film article of any of the preceding embodiments, wherein the longitudinal axis and the primary axis of all of the microstructures form a bias angle is about −45°.

Embodiment 9

The light redirecting film article of any of the preceding embodiments, wherein the light directing film is a strip having opposing end edges and opposing side edges, a length of the strip being defined between the opposing end edges and a width of the strip being defined between the opposing side edges, and further wherein the length is at least 10× the width, and even further wherein the longitudinal axis is in a direction of the length.

Embodiment 10

The light redirecting film article of any of the preceding embodiments, wherein each of the microstructures has a substantially triangular prism shape.

Embodiment 11

The light redirecting film article of any of the preceding embodiments, wherein each of the microstructures has a substantially triangular prism shape and wherein the primary axis is defined along a peak of the substantially triangular prism shape.

Embodiment 12

The light redirecting film article of any of the preceding embodiments, wherein each of the microstructures has a substantially triangular prism shape, wherein the primary axis is defined along a peak of the substantially triangular prism shape, wherein the substantially triangular prism shape includes opposing facets extending from the corresponding peak to the base layer, and further wherein at least one of the peak and opposing sides of at least one of the microstructures is non-linear in extension along the base layer.

Embodiment 13

The light redirecting film article of any of the preceding embodiments, wherein each of the microstructures has a substantially triangular prism shape, wherein the primary axis is defined along a peak of the substantially triangular prism shape, and wherein the peak of at least some of the microstructures is rounded.

Embodiment 14

The light redirecting film article of any of the preceding embodiments, wherein a peak of the substantially triangular prism shape defines an apex angle of about 120°.

Embodiment 15

The light redirecting film article of any of the preceding embodiments, wherein the microstructures project 5 micrometers-500 micrometers from the base layer.

Embodiment 16

The light redirecting film article of any of the preceding embodiments, wherein the base layer comprises a polymeric material.

Embodiment 17

The light redirecting film article of any of the preceding embodiments, wherein the microstructures comprise a polymeric material.

Embodiment 18

The light redirecting film article of any of the preceding embodiments, wherein the microstructures comprise a polymeric material, and wherein the microstructures comprises the same polymeric material as the base layer.

Embodiment 19

The light redirecting film article of any of the preceding embodiments, wherein the reflective layer comprises a material coating selected from the group consisting of a metallic material, an inorganic material, and an organic material.

Embodiment 20

The light redirecting film article of any of the preceding embodiments, further comprising an adhesive carried by the base layer opposite the microstructures.

Embodiment 21

The light redirecting film article of any of the preceding embodiments, wherein the light redirecting film is formed as a roll having a roll width of not more than 15.25 cm (6 inches).

Embodiment 22

A PV module, comprising:
a plurality of PV cells electrically connected by tabbing ribbons; and
a light redirecting film article applied over at least a portion of at least one of the tabbing ribbons, the light redirecting film article comprising:
a light redirecting film defining a longitudinal axis and including:
a base layer,
an ordered arrangement of a plurality of microstructures projecting from the base layer,
wherein each of the microstructures extends along the base layer to define a corresponding primary axis,
and further wherein the primary axis of at least one of the microstructures is oblique with respect to the longitudinal axis, and
a reflective layer over the microstructures opposite the base layer.

Embodiment 23

The PV module of any of the preceding embodiments directed to PV modules, wherein the at least one tabbing ribbon defines a length direction, and further wherein the light redirecting film article as applied over the at least one tabbing ribbon arranges the primary axis of the at least one microstructure to be oblique with respect to the length direction.

Embodiment 24

The PV module of any of the preceding embodiments directed to PV modules, further comprising the light redirecting film article applied to at least one additional region that is free of the PV cells.

Embodiment 25

The PV module of any of the preceding embodiments directed to PV modules, further comprising the light redirecting film article applied to at least one additional region that is free of the PV cells, and wherein the at least one additional region is a perimeter of at least one of the PV cells.

Embodiment 26

The PV module of any of the preceding embodiments directed to PV modules, further comprising the light redirecting film article applied to at least one additional region that is free of the PV cells, and wherein the at least one additional region is an area between an immediately adjacent pair of the PV cells.

Embodiment 27

The PV module of any of the preceding embodiments directed to PV modules, wherein the PV module exhibits substantially similar annual efficiency performance when installed in a landscape orientation or a portrait orientation.

Embodiment 28

A method of making a PV module including a plurality of PV cells electrically connected by tabbing ribbons, the method comprising:
applying a light redirecting film article over at least a portion of at least one of the tabbing ribbons, the light redirecting film article comprising:
a light redirecting film defining a longitudinal axis and including:
a base layer,
an ordered arrangement of a plurality of microstructures projecting from the base layer,
wherein each of the microstructures extends along the base layer to define a corresponding primary axis,
and further wherein the primary axis of at least one of the microstructures is oblique with respect to the longitudinal axis, and
a reflective layer over the microstructures opposite the base layer.

Embodiment 29

The method of any of the preceding embodiments directed to methods of making a PV module, further comprising applying a length of the light redirecting film article to a region between immediately adjacent ones of the PV cells.

Embodiment 30

The method of any of the preceding embodiments directed to methods of making a PV module, further comprising applying a length of the light redirecting film article about a perimeter of at least one of the PV cells.

Embodiment 31

A method of installing a PV module at an installation site, the PV module including a plurality of spaced apart PV cells arranged to define regions of the PV module that are free of PV cells, the method comprising:
applying a first light redirecting film article over at least a portion of one of the regions free of PV cells, the first light redirecting film article including:
a light redirecting film defining a longitudinal axis and including:
a base layer,
an ordered arrangement of a plurality of microstructures projecting from the base layer,
wherein each of the microstructures extends along the base layer to define a corresponding primary axis,
and further wherein the primary axis of at least one of the microstructures is oblique with respect to the longitudinal axis, and
a reflective layer over the microstructures opposite the base layer; and
mounting the PV module at the installation site;
wherein following the step of mounting, the primary axis of the at least one microstructure is substantially aligned with an East-West direction of the installation site.

Embodiment 32

The method of any of the preceding embodiments directed to methods of installing a PV module at an installation site, wherein following the step of applying the light redirecting film, a front-side layer is disposed over the PV cells in completing the PV module.

Embodiment 33

The method of any of the preceding embodiments directed to methods of installing a PV module at an installation site, wherein following the step of mounting, the primary axis of the at least one microstructure defines an angle with respect to the East-West direction of no more than 45 degrees.

Embodiment 34

The method of any of the preceding embodiments directed to methods of installing a PV module at an installation site, wherein following the step of mounting, the primary axis of the at least one microstructure defines an angle with respect to the East-West direction of no more than 20 degrees.

Embodiment 35

The method of any of the preceding embodiments directed to methods of installing a PV module at an installation site, wherein following the step of mounting, the primary axis of the at least one microstructure defines an angle with respect to the East-West direction of no more than 5 degrees.

Embodiment 36

The method of any of the preceding embodiments directed to methods of installing a PV module at an installation site, wherein the PV module defines a length direction and a width direction, and further wherein the light redirecting film article is disposed between two immediately adjacent ones of the PV cells and extends in the length direction.

Embodiment 37

The method of any of the preceding embodiments directed to methods of installing a PV module at an installation site, wherein the PV module defines a length direction and a width direction, and further wherein the light redirecting film article is disposed between two immediately adjacent ones of the PV cells and extends in the width direction.

Embodiment 38

The method of any of the preceding embodiments directed to methods of installing a PV module at an installation site, further comprising:
applying a second light redirecting film article over at least a portion of a second one of the regions free of the PV cells, the second light redirecting film article including:
a light redirecting film defining a longitudinal axis and including:
a base layer,
an ordered arrangement of a plurality of microstructures projecting from the base layer,
wherein each of the microstructures extends along the base layer to define a corresponding primary axis, and further wherein the primary axis of at least one of the microstructures is oblique with respect to the longitudinal axis, and a reflective layer over the microstructures opposite the base layer;

wherein the first and second light redirecting film articles extend in differing directions relative to a perimeter shape of the PV module;

and further wherein following the step of mounting, the primary axis of the at least one microstructure of the second light redirecting film article is substantially aligned with the East-West direction of the installation site.

Embodiment 39

The method of embodiment 38, wherein a bias angle of the at least one microstructure of the first light redirecting film article differs from a bias angle of the at least one microstructure of the second light redirecting film article.

Embodiment 40

A PV module, comprising:
a plurality of PV cells electrically connected by tabbing ribbons; and
a light redirecting film article applied over article applied to at least one region that is free of the PV cells, the light redirecting film article comprising:
a light redirecting film defining a longitudinal axis and including:
a base layer,
an ordered arrangement of a plurality of microstructures projecting from the base layer,
wherein each of the microstructures extends along the base layer to define a corresponding primary axis,
and further wherein the primary axis of at least one of the microstructures is oblique with respect to the longitudinal axis, and
a reflective layer over the microstructures opposite the base layer.

Embodiment 41

The PV module of embodiment 40, wherein the at least one tabbing ribbon defines a length direction, and further wherein the light redirecting film article applied over the at least one region that is free of the PV cells arranges the primary axis of the at least one microstructure to be oblique with respect to the length direction.

Embodiment 42

The PV module of any one of embodiments 40 to 41, wherein the at least one region that is free of the PV cells is a perimeter of at least one of the PV cells.

Embodiment 43

The PV module of any one of embodiments 40 to 42, wherein the at least one region that is free of the PV cells is an area between an immediately adjacent pair of the PV cells.

Embodiment 44

The PV module of any one of embodiments 40 to 43, wherein the PV module exhibits substantially similar annual efficiency performance when installed in a landscape orientation or a portrait orientation.

Embodiment 45a

The PV module of any one of embodiments 40 to 44, wherein the longitudinal axis and the primary axis of the at least one microstructure form a bias angle in the range of 1°-90°.

Embodiment 45b

The PV module of any one of embodiments 40 to 44, wherein the longitudinal axis and the primary axis of all of the microstructures form a bias angle in the range of 1°-90°.

Embodiment 45c

The PV module of any one of embodiments 40 to 44, wherein the longitudinal axis and the primary axis of the at least one microstructure form a bias angle in the range of −1°--90°.

Embodiment 45d

The PV module of any one of embodiments 40 to 44, wherein the longitudinal axis and the primary axis of all of the microstructures form a bias angle in the range of −1°--90°.

Embodiment 46a

The PV module of any one of embodiments 40 to 45, wherein the longitudinal axis and the primary axis of the at least one microstructure form a bias angle in the range of 1°-89°.

Embodiment 46b

The PV module of any one of embodiments 40 to 45, wherein the longitudinal axis and the primary axis of all of the microstructures form a bias angle in the range of 1°-89°.

Embodiment 46c

The PV module of any one of embodiments 40 to 45, wherein the longitudinal axis and the primary axis of the at least one microstructure form a bias angle in the range of −1°--89°.

Embodiment 46d

The PV module of any one of embodiments 40 to 45, wherein the longitudinal axis and the primary axis of all of the microstructures form a bias angle in the range of −1°--89°.

Embodiment 47a

The PV module of any one of embodiments 40 to 46, wherein the longitudinal axis and the primary axis of the at least one microstructure form a bias angle is in the range of 20°-70°.

Embodiment 47b

The PV module of any one of embodiments 40 to 47, wherein primary axis of each of the microstructures and the longitudinal axis form a bias angle in the range of 20°-70°.

Embodiment 48a

The PV module of any one of embodiments 40 to 46, wherein the longitudinal axis and the primary axis of the at least one microstructure form a bias angle is in the range of −20°−−70°.

Embodiment 48b

The PV module of any one of embodiments 40 to 47, wherein primary axis of each of the microstructures and the longitudinal axis form a bias angle in the range of −20°−−70°.

Embodiment 49

The PV module of any one of embodiments 40 to 48, wherein the longitudinal axis and the primary axis of the at least one microstructure form a bias angle is about 45°.

Embodiment 49a

The PV module of any one of embodiments 40 to 48, wherein the longitudinal axis and the primary axis of all of the microstructures form a bias angle is about −45°.

Embodiment 50a

The PV module of any one of embodiments 40 to 48, wherein the longitudinal axis and the primary axis of the at least one microstructure form a bias angle is about 45°.

Embodiment 50b

The PV module of any one of embodiments 40 to 48, wherein the longitudinal axis and the primary axis of all of the microstructures form a bias angle is about −45°.

FURTHER EXEMPLARY EMBODIMENTS

1. A light redirecting film article comprising:
a light redirecting film defining a longitudinal axis and including:
a base layer;
an ordered arrangement of a plurality of microstructures projecting from the base layer;
wherein each of the microstructures extends along the base layer to define a corresponding primary axis;
wherein the primary axis of at least one of the microstructures is oblique with respect to the longitudinal axis;
and further wherein the longitudinal axis and the primary axis of the at least one microstructure define a bias angle, and
a reflective layer over the microstructures opposite the base layer.

2. The light redirecting film article of embodiment 1, wherein the primary axis of a majority of the microstructures is oblique with respect to the longitudinal axis.

3. The light redirecting film article according to any of the preceding embodiments, wherein the primary axis of all of the microstructures is oblique with respect to the longitudinal axis.

4. The light redirecting film article according to any of the preceding embodiments, wherein the bias angle is in the range of 1° to 90°.

5. The light redirecting film article according to any of the preceding embodiments, wherein the bias angle is in the range of 1° to 89°.

6. The light redirecting film article according to any of the preceding embodiments, wherein the bias angle is in the range of 20° to 70°.

7. The light redirecting film article according to any of the preceding embodiments, wherein the bias angle formed between the primary axis and the longitudinal axis of each of the microstructures is in the range of −1° to −90°.

8. The light redirecting film article according to any of the preceding embodiments, wherein the bias angle formed between the primary axis and the longitudinal axis of each of the microstructures is in the range of −1° to −89°.

9. The light redirecting film article according to any of the preceding embodiments, wherein the bias angle formed between the primary axis and the longitudinal axis of each of the microstructures is in the range of −20° to −70°.

10. The light redirecting film article according to any of the preceding embodiments, wherein the bias angle is 45° plus or minus 2 degrees.

11. The light redirecting film article according to any of the preceding embodiments, wherein the bias angle is from 65° to 90°.

12. The light redirecting film article according to any of the preceding embodiments, wherein the bias angle is from 70° to 90°.

13. The light redirecting film article according to any of the preceding embodiments, wherein the bias angle is from 75° to 90°.

14. The light redirecting film article according to any of the preceding embodiments, wherein the bias angle is from 75° to 85°.

15. The light redirecting film article according to any of the preceding embodiments, wherein the bias angle is from 80° to 90°.

16. The light redirecting film article according to any of the preceding embodiments, wherein the bias angle is from 80° to 85°.

17. The light redirecting film article according to any of the preceding embodiments, wherein the bias angle is −45° plus or minus 2 degrees.

18. The light redirecting film article according to any of the preceding embodiments, wherein the bias angle is from −65° to −90°.

19. The light redirecting film article according to any of the preceding embodiments, wherein the bias angle is from −70° to −90°.

20. The light redirecting film article according to any of the preceding embodiments, wherein the bias angle is from −75° to −90°.

21. The light redirecting film article according to any of the preceding embodiments, wherein the bias angle is from −75° to −85°.

22. The light redirecting film article according to any of the preceding embodiments, wherein the bias angle is from −80° to −90°.

23. The light redirecting film article according to any of the preceding embodiments, wherein the bias angle is from −80° to −85°.

24. The light redirecting film article according to any of the preceding embodiments, wherein the bias angle is 74° plus or minus 2 degrees.

25. The light redirecting film article according to any of the preceding embodiments, wherein the bias angle is 75° plus or minus 2 degrees.
26. The light redirecting film article according to any of the preceding embodiments, wherein the bias angle is 76° plus or minus 2 degrees.
27. The light redirecting film article according to any of the preceding embodiments, wherein the bias angle is 77° plus or minus 2 degrees.
28. The light redirecting film article according to any of the preceding embodiments, wherein the bias angle is 78° plus or minus 2 degrees.
29. The light redirecting film article according to any of the preceding embodiments, wherein the bias angle is 79° plus or minus 2 degrees.
30. The light redirecting film article according to any of the preceding embodiments, wherein the bias angle is 80° plus or minus 2 degrees.
31. The light redirecting film article according to any of the preceding embodiments, wherein the bias angle is 81° plus or minus 2 degrees.
32. The light redirecting film article according to any of the preceding embodiments, wherein the bias angle is 82° plus or minus 2 degrees.
33. The light redirecting film article according to any of the preceding embodiments, wherein the bias angle is 83° plus or minus 2 degrees.
34. The light redirecting film article according to any of the preceding embodiments, wherein the bias angle is 84° plus or minus 2 degrees.
35. The light redirecting film article according to any of the preceding embodiments, wherein the bias angle is 85° plus or minus 2 degrees.
36. The light redirecting film article according to any of the preceding embodiments, wherein the bias angle is 86° plus or minus 2 degrees.
37. The light redirecting film article according to any of the preceding embodiments, wherein the bias angle is 87° plus or minus 2 degrees.
38. The light redirecting film article according to any of the preceding embodiments, wherein the bias angle is 88° plus or minus 2 degrees.
39. The light redirecting film article according to any of the preceding embodiments, wherein the bias angle is 89° plus or minus 2 degrees.
40. The light redirecting film article according to any of the preceding embodiments, wherein the bias angle is 90° plus or minus 2 degrees.
41. The light redirecting film article according to any of the preceding embodiments, wherein the bias angle is −74° plus or minus 2 degrees.
42. The light redirecting film article according to any of the preceding embodiments, wherein the bias angle is −75° plus or minus 2 degrees.
43. The light redirecting film article according to any of the preceding embodiments, wherein the bias angle is −76° plus or minus 2 degrees.
44. The light redirecting film article according to any of the preceding embodiments, wherein the bias angle is −77° plus or minus 2 degrees.
45. The light redirecting film article according to any of the preceding embodiments, wherein the bias angle is −78° plus or minus 2 degrees.
46. The light redirecting film article according to any of the preceding embodiments, wherein the bias angle is −79° plus or minus 2 degrees.
47. The light redirecting film article according to any of the preceding embodiments, wherein the bias angle is −80° plus or minus 2 degrees.
48. The light redirecting film article according to any of the preceding embodiments, wherein the bias angle is −81° plus or minus 2 degrees.
49. The light redirecting film article according to any of the preceding embodiments, wherein the bias angle is −82° plus or minus 2 degrees.
50. The light redirecting film article according to any of the preceding embodiments, wherein the bias angle is −83° plus or minus 2 degrees.
51. The light redirecting film article according to any of the preceding embodiments, wherein the bias angle is −84° plus or minus 2 degrees.
52. The light redirecting film article according to any of the preceding embodiments, wherein the bias angle is −85° plus or minus 2 degrees.
53. The light redirecting film article according to any of the preceding embodiments, wherein the bias angle is −86° plus or minus 2 degrees.
54. The light redirecting film article according to any of the preceding embodiments, wherein the bias angle is −87° plus or minus 2 degrees.
55. The light redirecting film article according to any of the preceding embodiments, wherein the bias angle is −88° plus or minus 2 degrees.
56. The light redirecting film article according to any of the preceding embodiments, wherein the bias angle is −89° plus or minus 2 degrees.
57. The light redirecting film article according to any of the preceding embodiments, wherein the bias angle is −90° plus or minus 2 degrees.
58. The light redirecting film article according to any of the preceding embodiments, wherein the light directing film is a strip having opposing end edges and opposing side edges, a length of the strip being defined between the opposing end edges and a width of the strip being defined between the opposing side edges, and further wherein the length is at least 10× the width, and even further wherein the longitudinal axis is in a direction of the length.
59. The light redirecting film article according to any of the preceding embodiments, wherein each of the microstructures has a substantially triangular prism shape.
60. The light redirecting film article according to any of the preceding embodiments, wherein each of the microstructures has a substantially triangular prism shape, and wherein the primary axis is defined along a peak of the substantially triangular prism shape.
61. The light redirecting film article according to any of the preceding embodiments, wherein each of the microstructures has a substantially triangular prism shape, wherein the primary axis is defined along a peak of the substantially triangular prism shape and, wherein the substantially triangular prism shape includes opposing facets extending from the corresponding peak to the base layer, and further wherein at least one of the peak and opposing sides of at least one of the microstructures is non-linear in extension along the base layer.
62. The light redirecting film article according to any of the preceding embodiments, wherein each of the microstructures has a substantially triangular prism shape, wherein the primary axis is defined along a peak of the substantially triangular prism shape and, wherein the peak of at least some of the microstructures is rounded.

63. The light redirecting film article according to any of the preceding embodiments, wherein a peak of the substantially triangular prism shape defines an apex angle of about 120°.

64. The light redirecting film article according to any of the preceding embodiments, wherein the microstructures project 5 micrometers-500 micrometers from the base layer.

65. The light redirecting film article according to any of the preceding embodiments, wherein the base layer comprises a polymeric material.

66. The light redirecting film article according to any of the preceding embodiments, wherein the microstructures comprise a polymeric material.

67. The light redirecting film article according to any of the preceding embodiments, wherein the microstructures comprise a polymeric material, and wherein the microstructures comprises the same polymeric material as the base layer.

68. The light redirecting film article according to any of the preceding embodiments, wherein the reflective layer comprises a material coating selected from the group consisting of a metallic material, an inorganic material, and an organic material.

69. The light redirecting film article of according to any of the preceding embodiments, further comprising:
an adhesive adjacent the base layer opposite the microstructures.

70. The light redirecting film article according to any of the preceding embodiments, wherein the light redirecting film is formed as a roll having a roll width of not more than 15.25 cm (6 inches).

71. A PV module, comprising:
a plurality of PV cells electrically connected by tabbing ribbons; and
a light redirecting film article applied over at least a portion of at least one of the tabbing ribbons, the light redirecting film article comprising:
a light redirecting film defining a longitudinal axis and including:
a base layer,
an ordered arrangement of a plurality of microstructures projecting from the base layer,
wherein each of the microstructures extends along the base layer to define a corresponding primary axis,
wherein the primary axis of at least one of the microstructures is oblique with respect to the longitudinal axis,
and further wherein the longitudinal axis and the primary axis of the at least one microstructure define a bias angle, and
a reflective layer over the microstructures opposite the base layer.

72. The PV module according to any of the preceding embodiments directed to a PV module, wherein the at least one tabbing ribbon defines a length direction, and further wherein the light redirecting film article as applied over the at least one tabbing ribbon arranges the primary axis of the at least one microstructure to be oblique with respect to the length direction.

73. The PV module according to any of the preceding embodiments directed to a PV module, further comprising the light redirecting film article applied to at least one additional region that is free of the PV cells.

74. The PV module according to any of the preceding embodiments directed to a PV module, further comprising light redirecting film article applied to the perimeter surrounding at least one of the PV cells.

75. The PV module according to any of the preceding embodiments directed to a PV module, further comprising light redirecting film article applied to an area between an immediately adjacent pair of the PV cells.

76. The PV module according to any of the preceding embodiments directed to a PV module, wherein the PV module exhibits substantially similar annual efficiency performance when installed in a landscape orientation or a portrait orientation.

77. The PV module according to any of the preceding embodiments directed to a PV module, wherein the light redirecting film article has a bias angle in the range of 1° to 90°.

78. The PV module according to any of the preceding embodiments directed to a PV module, wherein the light redirecting film article has a bias angle in the range of 20° to 70°.

79. The PV module according to any of the preceding embodiments directed to a PV module, wherein the bias angle formed between the primary axis and the longitudinal axis of each of the microstructures is in the range of −20° to −70°.

80. The PV module according to any of the preceding embodiments directed to a PV module, wherein the light redirecting film article has a bias angle is 45° plus or minus 2 degrees.

81. The PV module according to any of the preceding embodiments directed to a PV module, wherein the light redirecting film article has a bias angle is −45° plus or minus 2 degrees.

82. The PV module according to any of the preceding embodiments directed to a PV module, wherein the bias angle is from 65° to 90°.

83. The light redirecting film article according to any of the preceding embodiments, wherein the bias angle is from 70° to 90°.

84. The PV module according to any of the preceding embodiments directed to a PV module, wherein the bias angle is from 75° to 90°.

85. The PV module according to any of the preceding embodiments directed to a PV module, wherein the bias angle is from 75° to 85°.

86. The PV module according to any of the preceding embodiments directed to a PV module, wherein the bias angle is from 80° to 90°.

87. The PV module according to any of the preceding embodiments directed to a PV module, wherein the bias angle is from 80° to 85°.

88. The PV module according to any of the preceding embodiments directed to a PV module, wherein the bias angle is 74° plus or minus 2 degrees.

89. The PV module according to any of the preceding embodiments directed to a PV module, wherein the bias angle is 75° plus or minus 2 degrees.

90. The PV module according to any of the preceding embodiments directed to a PV module, wherein the bias angle is 76° plus or minus 2 degrees.

91. The PV module according to any of the preceding embodiments directed to a PV module, wherein the bias angle is 77° plus or minus 2 degrees.

92. The PV module according to any of the preceding embodiments directed to a PV module, wherein the bias angle is 78° plus or minus 2 degrees.

93. The PV module according to any of the preceding embodiments directed to a PV module, wherein the bias angle is 79° plus or minus 2 degrees.

94. The PV module according to any of the preceding embodiments directed to a PV module, wherein the bias angle is 80° plus or minus 2 degrees.

95. The PV module according to any of the preceding embodiments directed to a PV module, wherein the bias angle is 81° plus or minus 2 degrees.
96. The PV module according to any of the preceding embodiments directed to a PV module, wherein the bias angle is 82° plus or minus 2 degrees.
97. The PV module according to any of the preceding embodiments directed to a PV module, wherein the bias angle is 83° plus or minus 2 degrees.
98. The PV module according to any of the preceding embodiments directed to a PV module, wherein the bias angle is 84° plus or minus 2 degrees.
99. The PV module according to any of the preceding embodiments directed to a PV module, wherein the bias angle is 85° plus or minus 2 degrees.
100. The PV module according to any of the preceding embodiments directed to a PV module, wherein the bias angle is 86° plus or minus 2 degrees.
101. The PV module according to any of the preceding embodiments directed to a PV module, wherein the bias angle is 87° plus or minus 2 degrees.
102. The PV module according to any of the preceding embodiments directed to a PV module, wherein the bias angle is 88° plus or minus 2 degrees.
103. The PV module according to any of the preceding embodiments directed to a PV module, wherein the bias angle is 89° plus or minus 2 degrees.
104. The PV module according to any of the preceding embodiments directed to a PV module, wherein the bias angle is 90° plus or minus 2 degrees.
105. The PV module according to any of the preceding embodiments directed to a PV module, wherein the bias angle is from −65° to −90°.
106. The light redirecting film article according to any of the preceding embodiments, wherein the bias angle is from −70° to −90°.
107. The PV module according to any of the preceding embodiments directed to a PV module, wherein the bias angle is from −75° to −90°.
108. The PV module according to any of the preceding embodiments directed to a PV module, wherein the bias angle is from −5° to −85°.
109. The PV module according to any of the preceding embodiments directed to a PV module, wherein the bias angle is from −80° to −90°.
110. The PV module according to any of the preceding embodiments directed to a PV module, wherein the bias angle is from −80° to −85°.
111. The PV module according to any of the preceding embodiments directed to a PV module, wherein the bias angle is −74° plus or minus −2 degrees.
112. The PV module according to any of the preceding embodiments directed to a PV module, wherein the bias angle is −75° plus or minus −2 degrees.
113. The PV module according to any of the preceding embodiments directed to a PV module, wherein the bias angle is −76° plus or minus 2 degrees.
114. The PV module according to any of the preceding embodiments directed to a PV module, wherein the bias angle is −77° plus or minus 2 degrees.
115. The PV module according to any of the preceding embodiments directed to a PV module, wherein the bias angle is −78° plus or minus 2 degrees.
116. The PV module according to any of the preceding embodiments directed to a PV module, wherein the bias angle is −79° plus or minus 2 degrees.
117. The PV module according to any of the preceding embodiments directed to a PV module, wherein the bias angle is −80° plus or minus 2 degrees.
118. The PV module according to any of the preceding embodiments directed to a PV module, wherein the bias angle is −81° plus or minus 2 degrees.
119. The PV module according to any of the preceding embodiments directed to a PV module, wherein the bias angle is −82° plus or minus 2 degrees.
120. The PV module according to any of the preceding embodiments directed to a PV module, wherein the bias angle is −83° plus or minus 2 degrees.
121. The PV module according to any of the preceding embodiments directed to a PV module, wherein the bias angle is −84° plus or minus 2 degrees.
122. The PV module according to any of the preceding embodiments directed to a PV module, wherein the bias angle is −85° plus or minus 2 degrees.
123. The PV module according to any of the preceding embodiments directed to a PV module, wherein the bias angle is −86° plus or minus 2 degrees.
124. The PV module according to any of the preceding embodiments directed to a PV module, wherein the bias angle is −87° plus or minus 2 degrees.
125. The PV module according to any of the preceding embodiments directed to a PV module, wherein the bias angle is 88° plus or minus 2 degrees.
126. The PV module according to any of the preceding embodiments directed to a PV module, wherein the bias angle is −89° plus or minus 2 degrees.
127. The PV module according to any of the preceding embodiments directed to a PV module, wherein the bias angle is −90° plus or minus 2 degrees.
128. A method of making a PV module including a plurality of PV cells electrically connected by tabbing ribbons, the method comprising:

applying a light redirecting film article over at least a portion of at least one of the tabbing ribbons, the light redirecting film article comprising:

a light redirecting film defining a longitudinal axis and including:

a base layer, an ordered arrangement of a plurality of microstructures projecting from the base layer, wherein each of the microstructures extends along the base layer to define a corresponding primary axis, wherein the primary axis of at least one of the microstructures is oblique with respect to the longitudinal axis, and further wherein the longitudinal axis and the primary axis of the at least one microstructure define a bias angle, and a reflective layer over the microstructures opposite the base layer.

129. The method according to any of the preceding embodiments directed to methods of making a PV module, further comprising:

applying a length of the light redirecting film article to a region between immediately adjacent PV cells.

130. The method of according to any of the preceding embodiments directed to methods of making a PV module, further comprising:

applying a length of the light redirecting film article about a perimeter of at least one of the PV cells.

131. A method of installing a PV module at an installation site, the PV module including a plurality of spaced apart PV cells arranged to define regions of the PV module that are free of PV cells, the method comprising:

applying a first light redirecting film article over at least a portion of one of the regions free of PV cells, the first light redirecting film article including:
  a light redirecting film defining a longitudinal axis and including:
    a base layer,
    an ordered arrangement of a plurality of microstructures projecting from the base layer,
    wherein each of the microstructures extends along the base layer to define a corresponding primary axis,
    and further wherein the primary axis of at least one of the microstructures is oblique with respect to the longitudinal axis, and
    a reflective layer over the microstructures opposite the base layer; and
  mounting the PV module at the installation site;
    wherein following the step of mounting, the primary axis of the at least one microstructure is substantially aligned with an East-West direction of the installation site.

132. The method according to any of the preceding embodiments directed to methods of installing a PV module, wherein following the step of applying the light redirecting film, a front-side layer is disposed over the PV cells in completing the PV module.

133. The method according to any of the preceding embodiments directed to methods of installing a PV module, wherein following the step of mounting, the primary axis of the at least one microstructure defines an angle with respect to the East-West direction of no more than 45 degrees.

134. The method according to any of the preceding embodiments directed to methods of installing a PV module, wherein following the step of mounting, the primary axis of the at least one microstructure defines an angle with respect to the East-West direction of no more than 20 degrees.

135. The method according to any of the preceding embodiments directed to methods of installing a PV module, wherein following the step of mounting, the primary axis of the at least one microstructure defines an angle with respect to the East-West direction of no more than 5 degrees.

136. The method according to any of the preceding embodiments directed to methods of installing a PV module, wherein the PV module defines a length direction and a width direction, and further wherein the light redirecting film article is disposed between two immediately adjacent PV cells and extends in the length direction.

137. The method according to any of the preceding embodiments directed to methods of installing a PV module, wherein the PV module defines a length direction and a width direction, and further wherein the light redirecting film article is disposed between two immediately adjacent PV cells and extends in the width direction.

138. The method according to any of the preceding embodiments directed to methods of installing a PV module, further comprising:
  applying a second light redirecting film article over at least a portion of a second one of the regions free of the PV cells, the second light redirecting film article including:
    a light redirecting film defining a longitudinal axis and including:
      a base layer,
      an ordered arrangement of a plurality of microstructures projecting from the base layer,
      wherein each of the microstructures extends along the base layer to define a corresponding primary axis,
      and further wherein the primary axis of at least one of the microstructures is oblique with respect to the longitudinal axis, and
      a reflective layer over the microstructures opposite the base layer;
  wherein the first and second light redirecting film articles extend in differing directions relative to a perimeter shape of the PV module;
  and further wherein following the step of mounting, the primary axis of the at least one microstructure of the second light redirecting film article is substantially aligned with the East-West direction of the installation site.

139. The method of embodiment 88, wherein a bias angle of the at least one microstructure of the first light redirecting film article differs from a bias angle of the at least one microstructure of the second light redirecting film article.

140. A solar panel, comprising:
  a plurality of PV cells electrically connected by tabbing ribbons; and
  a light redirecting film article applied over at least one region that is free of the PV cells, the light redirecting film article comprising:
    a light redirecting film defining a longitudinal axis and including:
      a base layer,
      an ordered arrangement of a plurality of microstructures projecting from the base layer,
      wherein each of the microstructures extends along the base layer to define a corresponding primary axis,
      wherein the primary axis of at least one of the microstructures is oblique with respect to the longitudinal axis,
      and further wherein the longitudinal axis and the primary axis of the at least one microstructure define a bias angle, and
      a reflective layer over the microstructures opposite the base layer.

141. The solar panel according to any of the preceding embodiments directed to a solar panel, wherein the at least one tabbing ribbon defines a length direction, and further wherein the light redirecting film article applied over the at least one region that is free of the PV cells arranges the primary axis of the at least one microstructure to be oblique with respect to the length direction.

142. The solar panel according to any of the preceding embodiments directed to a solar panel, wherein the at least one region that is free of the PV cells is a perimeter of at least one of the PV cells.

143. The solar panel according to any of the preceding embodiments directed to a solar panel, wherein the at least one region that is free of the PV cells is an area between an immediately adjacent pair of the PV cells.

144. The solar panel according to any of the preceding embodiments directed to a solar panel, wherein the solar panel exhibits substantially similar annual efficiency performance when installed in a landscape orientation or a portrait orientation.

145. The solar panel according to any of the preceding embodiments directed to a solar panel, wherein the bias angle in the range of 1° to 90°.

146. The solar panel according to any of the preceding embodiments directed to a solar panel, wherein the bias angle in the range of 20° to 70°.

147. The solar panel according to any of the preceding embodiments directed to a solar panel, wherein the bias angle in the range of −20° to −70°.

148. The solar panel according to any of the preceding embodiments directed to a solar panel, wherein the bias angle is 45° plus or minus 2 degrees.
149. The solar panel according to any of the preceding embodiments directed to a solar panel, wherein the bias angle is from 65° to 90°.
150. The solar panel according to any of the preceding embodiments directed to a solar panel, wherein the bias angle is from 70° to 90°.
151. The solar panel according to any of the preceding embodiments directed to a solar panel, wherein the bias angle is from 75° to 90°.
152. The solar panel according to any of the preceding embodiments directed to a solar panel, wherein the bias angle is from 75° to 85°.
153. The solar panel according to any of the preceding embodiments directed to a solar panel, wherein the bias angle is from 80° to 90°.
154. The solar panel according to any of the preceding embodiments directed to a solar panel, wherein the bias angle is from 80° to 85°.
155. The solar panel according to any of the preceding embodiments directed to a solar panel, wherein the bias angle is 74° plus or minus 2 degrees.
156. The solar panel according to any of the preceding embodiments directed to a solar panel, wherein the bias angle is 75° plus or minus 2 degrees.
157. The solar panel according to any of the preceding embodiments directed to a solar panel, wherein the bias angle is 76° plus or minus 2 degrees.
158. The solar panel according to any of the preceding embodiments directed to a solar panel, wherein the bias angle is 77° plus or minus 2 degrees.
159. The solar panel according to any of the preceding embodiments directed to a solar panel, wherein the bias angle is 78° plus or minus 2 degrees.
160. The solar panel according to any of the preceding embodiments directed to a solar panel, wherein the bias angle is 79° plus or minus 2 degrees.
161. The solar panel according to any of the preceding embodiments directed to a solar panel, wherein the bias angle is 80° plus or minus 2 degrees.
162. The solar panel according to any of the preceding embodiments directed to a solar panel, wherein the bias angle is 81° plus or minus 2 degrees.
163. The solar panel according to any of the preceding embodiments directed to a solar panel, wherein the bias angle is 82° plus or minus 2 degrees.
164. The solar panel according to any of the preceding embodiments directed to a solar panel, wherein the bias angle is 83° plus or minus 2 degrees.
165. The solar panel according to any of the preceding embodiments directed to a solar panel, wherein the bias angle is 84° plus or minus 2 degrees.
166. The solar panel according to any of the preceding embodiments directed to a solar panel, wherein the bias angle is 85° plus or minus 2 degrees.
167. The solar panel according to any of the preceding embodiments directed to a solar panel, wherein the bias angle is 86° plus or minus 2 degrees.
168. The solar panel according to any of the preceding embodiments directed to a solar panel, wherein the bias angle is 87° plus or minus 2 degrees.
169. The solar panel according to any of the preceding embodiments directed to a solar panel, wherein the bias angle is 88° plus or minus 2 degrees.
170. The solar panel according to any of the preceding embodiments directed to a solar panel, wherein the bias angle is 89° plus or minus 2 degrees.
171. The solar panel according to any of the preceding embodiments directed to a solar panel, wherein the bias angle is 90° plus or minus 2 degrees.
172. The solar panel according to any of the preceding embodiments directed to a solar panel, wherein the bias angle in the range of 1° to 90°.
173. The solar panel according to any of the preceding embodiments directed to a solar panel, wherein the bias angle in the range of 20° to 70°.
174. The solar panel according to any of the preceding embodiments directed to a solar panel, wherein the bias angle in the range of −20° to −70°.
175. The solar panel according to any of the preceding embodiments directed to a solar panel, wherein the bias angle is −45° plus or minus 2 degrees.
176. The solar panel according to any of the preceding embodiments directed to a solar panel, wherein the bias angle is from −65° to −90°.
177. The solar panel according to any of the preceding embodiments directed to a solar panel, wherein the bias angle is from −70° to −90°.
178. The solar panel according to any of the preceding embodiments directed to a solar panel, wherein the bias angle is from −75° to −90°.
179. The solar panel according to any of the preceding embodiments directed to a solar panel, wherein the bias angle is from −75° to −85°.
180. The solar panel according to any of the preceding embodiments directed to a solar panel, wherein the bias angle is from −80° to −90°.
181. The solar panel according to any of the preceding embodiments directed to a solar panel, wherein the bias angle is from −80° to −85°.
182. The solar panel according to any of the preceding embodiments directed to a solar panel, wherein the bias angle is −74° plus or minus 2 degrees.
183. The solar panel according to any of the preceding embodiments directed to a solar panel, wherein the bias angle is −75° plus or minus 2 degrees.
184. The solar panel according to any of the preceding embodiments directed to a solar panel, wherein the bias angle is −76° plus or minus 2 degrees.
185. The solar panel according to any of the preceding embodiments directed to a solar panel, wherein the bias angle is −77° plus or minus 2 degrees.
186. The solar panel according to any of the preceding embodiments directed to a solar panel, wherein the bias angle is −78° plus or minus 2 degrees.
187. The solar panel according to any of the preceding embodiments directed to a solar panel, wherein the bias angle is −79° plus or minus 2 degrees.
188. The solar panel according to any of the preceding embodiments directed to a solar panel, wherein the bias angle is −80° plus or minus 2 degrees.
189. The solar panel according to any of the preceding embodiments directed to a solar panel, wherein the bias angle is −81° plus or minus 2 degrees.
190. The solar panel according to any of the preceding embodiments directed to a solar panel, wherein the bias angle is −82° plus or minus 2 degrees.
191. The solar panel according to any of the preceding embodiments directed to a solar panel, wherein the bias angle is −83° plus or minus 2 degrees.

192. The solar panel according to any of the preceding embodiments directed to a solar panel, wherein the bias angle is −84° plus or minus 2 degrees.
193. The solar panel according to any of the preceding embodiments directed to a solar panel, wherein the bias angle is −85° plus or minus 2 degrees.
194. The solar panel according to any of the preceding embodiments directed to a solar panel, wherein the bias angle is −86° plus or minus 2 degrees.
195. The solar panel according to any of the preceding embodiments directed to a solar panel, wherein the bias angle is −87° plus or minus 2 degrees.
196. The solar panel according to any of the preceding embodiments directed to a solar panel, wherein the bias angle is −88° plus or minus 2 degrees.
197. The solar panel according to any of the preceding embodiments directed to a solar panel, wherein the bias angle is −89° plus or minus 2 degrees.
198. The solar panel according to any of the preceding embodiments directed to a solar panel, wherein the bias angle is −90° plus or minus 2 degrees.

What is claimed is:

1. A light redirecting film article comprising a light redirecting film having a length and a width, the length being longer than the width, wherein the light redirecting film defines an X-Y plane, wherein the length of the light redirecting film defines a longitudinal axis in the X direction, the light redirecting film comprising:
    a base layer;
    an ordered arrangement of a plurality of microstructures projecting from the base layer;
wherein each of the microstructures projects from the base layer in a Z direction,
wherein the microstructures have an elongated shape that extends in the X-Y plane,
wherein the elongated shape of each of the microstructures defines a primary axis for each of the microstructures in the X-Y plane;
wherein the primary axis of a majority of the microstructures is oblique with respect to the longitudinal axis;
wherein the longitudinal axis and the primary axis of at least one microstructure define a bias angle in the X-Y plane; and
wherein the bias angle is within the range of 20 to 70 degrees or the range of −20 to −70 degrees; and
    a reflective layer over the microstructures opposite the base layer.

2. The light redirecting film article according to claim 1, wherein each of the microstructures has a substantially triangular prism shape, wherein the primary axis is defined along a peak of the substantially triangular prism shape, and wherein the substantially triangular prism shape includes opposing facets extending from the peak to the base layer.

3. The light redirecting film article according to claim 2, and further wherein at least one of the peak and opposing sides of at least one of the microstructures is non-linear in extension along the base layer.

4. The light redirecting film article according to claim 2, and further wherein there are variations in at least one of the facets along the primary axis.

5. The light redirecting film article according to claim 2, wherein the peak of at least some of the microstructures is rounded.

6. The light redirecting film article according to claim 2, wherein the peak of the substantially triangular prism shape defines an apex angle of about 120 degrees.

7. A PV module, comprising:
    a plurality of PV cells electrically connected by tabbing ribbons; wherein each of the PV cells has a perimeter, and
    a light redirecting film article applied over a surface chosen from: at least a portion of at least one of the tabbing ribbons, at least one region that is free of the PV cells, around the perimeter of at least one of the PV cells, an area between an immediately adjacent pair of the PV cells, and combinations thereof,
wherein the light redirecting film article comprises a light redirecting film having a length and a width, the length being longer than the width, wherein the light redirecting film defines an X-Y plane, wherein the length of the light redirecting film defines a longitudinal axis in the X direction, the light redirecting film comprising:
    a base layer;
    an ordered arrangement of a plurality of microstructures projecting from the base layer;
        wherein each of the microstructures projects from the base layer in a Z direction,
        wherein the microstructures have an elongated shape that extends in the X-Y plane,
        wherein the elongated shape of each of the microstructures defines a corresponding primary axis in the X-Y plane;
        wherein the primary axis of a majority of the microstructures is oblique with respect to the longitudinal axis;
        wherein the longitudinal axis and the primary axis of at least one microstructure define a bias angle in the X-Y plane; and
        wherein the bias angle is within the range of 20 to 70 degrees or the range of −20 to −70 degrees; and
    a reflective layer over the microstructures opposite the base layer.

8. The PV module according to claim 7, wherein each of the microstructures has a substantially triangular prism shape, wherein the primary axis is defined along a peak of the substantially triangular prism shape, and wherein the substantially triangular prism shape includes opposing facets extending from the peak to the base layer.

9. The PV module according to claim 8, and further wherein at least one of the peak and opposing sides of at least one of the microstructures is non-linear in extension along the base layer.

10. The PV module according to claim 8, and further wherein there are variations in at least one of the facets along the primary axis.

11. The PV module according to claim 8, wherein the peak of at least some of the microstructures is rounded.

12. The light redirecting film article according to claim 8, wherein the peak of the substantially triangular prism shape defines an apex angle of about 120 degrees.

* * * * *

UNITED STATES PATENT AND TRADEMARK OFFICE
CERTIFICATE OF CORRECTION

PATENT NO. : 10,510,913 B2
APPLICATION NO. : 16/188956
DATED : December 17, 2019
INVENTOR(S) : Mark O'Neill et al.

Page 1 of 1

It is certified that error appears in the above-identified patent and that said Letters Patent is hereby corrected as shown below:

In the Specification

Column 2,
Line 41, delete "non tracking" and insert -- non-tracking --, therefor.

Column 11,
Line 7, delete "N,Ndiethyl" and insert -- N,N-diethyl --, therefor.

Column 13,
Line 32, delete "butryral" and insert -- butyral --, therefor.
Line 33, delete "ionmers." and insert -- ionomers. --, therefor.

Column 18,
Line 36, after "-82°" insert -- ) --.

Column 24,
Line 52, delete "Occassionally," and insert -- Occasionally, --, therefor.

Column 28,
Line 6, delete "7-0°." and insert -- 70°. --, therefor.

Signed and Sealed this
Eleventh Day of August, 2020

Andrei Iancu
*Director of the United States Patent and Trademark Office*